(12) United States Patent
Platzgummer

(10) Patent No.: US 9,520,268 B2
(45) Date of Patent: *Dec. 13, 2016

(54) COMPENSATION OF IMAGING DEVIATIONS IN A PARTICLE-BEAM WRITER USING A CONVOLUTION KERNEL

(71) Applicant: IMS Nanofabrication AG, Vienna (AT)

(72) Inventor: Elmar Platzgummer, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 0 days.

This patent is subject to a terminal disclaimer.

(21) Appl. No.: 14/795,535

(22) Filed: Jul. 9, 2015

(65) Prior Publication Data

US 2016/0013019 A1 Jan. 14, 2016

Related U.S. Application Data

(60) Provisional application No. 62/094,372, filed on Dec. 19, 2014.

(30) Foreign Application Priority Data

Jul. 10, 2014 (EP) ..................................... 14176563
Dec. 19, 2014 (EP) ..................................... 14199183

(51) Int. Cl.
*G21K 5/04* (2006.01)
*H01J 37/317* (2006.01)
(Continued)

(52) U.S. Cl.
CPC ....... *H01J 37/3177* (2013.01); *G06F 17/5072* (2013.01); *G06F 17/5081* (2013.01);
(Continued)

(58) Field of Classification Search
USPC ....... 250/396 R, 397, 492.1, 492.2, 492.21, 250/492.22, 492.23, 492.3
See application file for complete search history.

(56) References Cited

U.S. PATENT DOCUMENTS 1,033,741 A 7/1912 Sims
1,420,104 A 6/1922 Howe et al.
(Continued)

FOREIGN PATENT DOCUMENTS

CN 202204836 U 4/2012
EP 1033741 A2 9/2000
(Continued)

OTHER PUBLICATIONS

European Search Report for Application 15159397.7, report dated Sep. 28, 2015, 8 pgs.
(Continued)

*Primary Examiner* — Nicole Ippolito
(74) *Attorney, Agent, or Firm* — KPPB LLP

(57) ABSTRACT

An exposure pattern is computed for exposing a desired pattern on a target in a charged-particle multi-beam processing apparatus to match a reference writing tool, and/or for compensating a deviation of the imaging from a pattern definition device onto the target from a desired value of critical dimension along at least one direction in the image area on the target: The desired pattern is provided as a graphical representation suitable for the reference tool, on the image area on the target. A convolution kernel is used which describes a mapping from an element of the graphical representation to a group of pixels which is centered around a nominal position of said element. A nominal exposure pattern is calculated by convolution of the graphical representation with the convolution kernel, said nominal exposure pattern being suitable to create a nominal dose distribution on the target when exposed with the processing apparatus.

16 Claims, 29 Drawing Sheets

(51) Int. Cl.
  *H01J 37/302*  (2006.01)
  *G06F 17/50*  (2006.01)
  *H01J 37/09*  (2006.01)
  *H01J 37/04*  (2006.01)

(52) U.S. Cl.
  CPC ............ *H01J 37/045* (2013.01); *H01J 37/09* (2013.01); *H01J 37/3026* (2013.01); *H01J 37/3175* (2013.01); H01J 2237/043 (2013.01); H01J 2237/31725 (2013.01); H01J 2237/31764 (2013.01)

(56) References Cited

U.S. PATENT DOCUMENTS

| | | |
|---|---|---|
| 1,903,005 A | 3/1933 | Mccuen |
| 2,187,427 A | 1/1940 | Middleton |
| 2,820,109 A | 1/1958 | Dewitz |
| 2,920,104 A | 1/1960 | Brooks et al. |
| 3,949,265 A | 4/1976 | Holl |
| 4,467,211 A | 8/1984 | Smith et al. |
| 4,735,881 A | 4/1988 | Kobayashi et al. |
| 5,103,101 A | 4/1992 | Berglund et al. |
| 5,260,579 A | 11/1993 | Yasuda et al. |
| 5,369,282 A | 11/1994 | Arai et al. |
| 5,399,872 A | 3/1995 | Yasuda et al. |
| 5,814,423 A | 9/1998 | Maruyama et al. |
| 5,841,145 A | 11/1998 | Satoh et al. |
| 5,847,959 A | 12/1998 | Veneklasen et al. |
| 5,857,815 A | 1/1999 | Bailey et al. |
| 5,876,902 A | 3/1999 | Veneklasen |
| 5,933,211 A | 8/1999 | Nakasugi et al. |
| 6,014,200 A | 1/2000 | Sogard et al. |
| 6,043,496 A | 3/2000 | Tennant |
| 6,049,085 A | 4/2000 | Ema |
| 6,111,932 A | 8/2000 | Dinsmore |
| 6,137,113 A | 10/2000 | Muraki |
| 6,225,637 B1 | 5/2001 | Terashima et al. |
| 6,229,595 B1 | 5/2001 | McKinley et al. |
| 6,252,339 B1 | 6/2001 | Kendall |
| 6,280,798 B1 | 8/2001 | Ring et al. |
| 6,333,138 B1 | 12/2001 | Higashikawa et al. |
| 6,472,673 B1 | 10/2002 | Chalupka et al. |
| 6,473,237 B2 | 10/2002 | Mei |
| 6,552,353 B1 | 4/2003 | Muraki et al. |
| 6,617,587 B2 | 9/2003 | Parker |
| 6,767,125 B2 | 7/2004 | Midas et al. |
| 6,768,123 B2 | 7/2004 | Giering |
| 6,768,125 B2 | 7/2004 | Platzgummer et al. |
| 6,786,125 B2 | 9/2004 | Imai |
| 6,835,937 B1 | 12/2004 | Muraki et al. |
| 6,858,118 B2 | 2/2005 | Platzgummer et al. |
| 6,965,153 B1 | 11/2005 | Ono et al. |
| 7,084,411 B2 | 8/2006 | Lammer-Pachlinger et al. |
| 7,124,660 B2 | 10/2006 | Chiang |
| 7,129,024 B2 | 10/2006 | Ki |
| 7,199,373 B2 | 4/2007 | Stengl et al. |
| 7,201,213 B2 | 4/2007 | Leeson et al. |
| 7,214,951 B2 | 5/2007 | Stengl et al. |
| 7,276,714 B2 | 10/2007 | Platzgummer et al. |
| 7,459,247 B2 | 12/2008 | Bijnen et al. |
| 7,687,783 B2 | 3/2010 | Platzgummer et al. |
| 7,710,634 B2 | 5/2010 | Sandstrom |
| 7,714,298 B2 | 5/2010 | Platzgummer et al. |
| 7,772,574 B2 | 8/2010 | Stengl et al. |
| 7,777,201 B2 | 8/2010 | Fragner et al. |
| 7,781,748 B2 | 8/2010 | Platzgummer et al. |
| 7,823,081 B2 | 10/2010 | Sato et al. |
| 8,057,972 B2 | 11/2011 | Fragner et al. |
| 8,183,543 B2 | 5/2012 | Platzgummer et al. |
| 8,198,601 B2 | 6/2012 | Platzgummer et al. |
| 8,222,621 B2 | 7/2012 | Fragner et al. |
| 8,227,768 B2 | 7/2012 | Smick et al. |
| 8,257,888 B2 | 9/2012 | Sczyrba et al. |
| 8,258,488 B2 | 9/2012 | Platzgummer et al. |
| 8,294,117 B2 | 10/2012 | Kruit et al. |
| 8,304,749 B2 | 11/2012 | Platzgummer et al. |
| 8,378,320 B2 | 2/2013 | Platzgummer |
| 8,502,174 B2 | 8/2013 | Wieland |
| 8,546,767 B2 | 10/2013 | Platzgummer et al. |
| 8,563,942 B2 | 10/2013 | Platzgummer |
| 8,598,544 B2 | 12/2013 | Van de Peut et al. |
| 9,053,906 B2 | 6/2015 | Platzgummer |
| 9,093,201 B2 | 7/2015 | Platzgummer et al. |
| 9,099,277 B2 | 8/2015 | Platzgummer |
| 9,188,874 B1 | 11/2015 | Johnson |
| 9,269,543 B2 | 2/2016 | Reiter et al. |
| 9,373,482 B2 * | 6/2016 | Platzgummer ...... H01J 37/3026 |
| 2001/0028038 A1 | 10/2001 | Hamaguchi et al. |
| 2002/0021426 A1 | 2/2002 | Mei et al. |
| 2002/0148978 A1 | 10/2002 | Innes et al. |
| 2003/0085360 A1 | 5/2003 | Parker et al. |
| 2003/0106230 A1 | 6/2003 | Hennessey |
| 2003/0155534 A1 | 8/2003 | Platzgummer et al. |
| 2003/0160980 A1 | 8/2003 | Olsson et al. |
| 2004/0058536 A1 | 3/2004 | Ki |
| 2004/0119021 A1 | 6/2004 | Parker et al. |
| 2004/0157407 A1 | 8/2004 | Tong et al. |
| 2004/0169147 A1 | 9/2004 | Ono et al. |
| 2005/0063510 A1 | 3/2005 | Hieronimi et al. |
| 2005/0072941 A1 | 4/2005 | Tanimoto et al. |
| 2005/0104013 A1 | 5/2005 | Stengl et al. |
| 2005/0242302 A1 | 11/2005 | Platzgummer et al. |
| 2005/0242303 A1 | 11/2005 | Platzgummer |
| 2006/0060775 A1 | 3/2006 | Sakakibara et al. |
| 2006/0076509 A1 | 4/2006 | Okino et al. |
| 2006/0169925 A1 | 8/2006 | Miyajima et al. |
| 2007/0138374 A1 | 6/2007 | Nishibashi et al. |
| 2007/0178407 A1 | 8/2007 | Hatakeyama et al. |
| 2007/0279768 A1 | 12/2007 | Shibazaki et al. |
| 2008/0024745 A1 | 1/2008 | Baselmans et al. |
| 2008/0080782 A1 | 4/2008 | Olsson et al. |
| 2008/0099693 A1 | 5/2008 | Platzgummer et al. |
| 2008/0105827 A1 | 5/2008 | Tamamushi |
| 2008/0128638 A1 | 6/2008 | Doering et al. |
| 2008/0142728 A1 | 6/2008 | Smick et al. |
| 2008/0198352 A1 | 8/2008 | Kugler et al. |
| 2008/0203317 A1 | 8/2008 | Platzgummer et al. |
| 2008/0237460 A1 | 10/2008 | Fragner et al. |
| 2008/0257096 A1 | 10/2008 | Zhu et al. |
| 2008/0260283 A1 | 10/2008 | Ivansen et al. |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0101816 A1 | 4/2009 | Noji et al. |
| 2009/0256075 A1 | 10/2009 | Kemen et al. |
| 2009/0321631 A1 | 12/2009 | Smick et al. |
| 2010/0127185 A1 | 5/2010 | Fragner et al. |
| 2010/0178602 A1 | 7/2010 | Seto et al. |
| 2010/0187434 A1 | 7/2010 | Platzgummer et al. |
| 2010/0288938 A1 | 11/2010 | Platzgummer |
| 2011/0053087 A1 | 3/2011 | Nielsen et al. |
| 2011/0073782 A1 | 3/2011 | Wieland |
| 2011/0204253 A1 | 8/2011 | Platzgummer et al. |
| 2011/0226968 A1 | 9/2011 | Platzgummer |
| 2012/0076269 A1 | 3/2012 | Roberts et al. |
| 2012/0085940 A1 | 4/2012 | Matsumoto |
| 2012/0211674 A1 | 8/2012 | Kato |
| 2012/0286169 A1 | 11/2012 | Van de Peut et al. |
| 2012/0286170 A1 | 11/2012 | Van De Peut et al. |
| 2012/0288787 A1 | 11/2012 | Choi et al. |
| 2013/0157198 A1 | 6/2013 | Ogasawara et al. |
| 2013/0164684 A1 | 6/2013 | Yamanaka |
| 2013/0252145 A1 | 9/2013 | Matsumoto et al. |
| 2013/0253688 A1 | 9/2013 | Matsumoto et al. |
| 2014/0042334 A1 | 2/2014 | Wieland |
| 2014/0197327 A1 | 7/2014 | Platzgummer |
| 2014/0240732 A1 | 8/2014 | Tinnemans et al. |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0248993 A1 | 9/2015 | Reiter et al. |
| 2015/0311030 A1 | 10/2015 | Platzgummer et al. |

(56) References Cited

U.S. PATENT DOCUMENTS

2015/0311031 A1 10/2015 Platzgummer et al.
2016/0012170 A1* 1/2016 Platzgummer ...... G06F 17/5072
　　　　　　　　　　　　　　　　　　　　　　　　　　　　　250/396 R
2016/0071684 A1 3/2016 Platzgummer et al.

FOREIGN PATENT DOCUMENTS

| | | |
|---|---|---|
| EP | 2019415 A1 | 1/2009 |
| EP | 2187427 A2 | 5/2010 |
| EP | 2214194 A1 | 8/2010 |
| EP | 2317535 A2 | 5/2011 |
| EP | 2363875 A1 | 9/2011 |
| GB | 2349737 A | 11/2000 |
| JP | 08213301 A | 8/1996 |
| JP | 2006019436 A | 1/2006 |
| JP | 2006332289 | 12/2006 |
| WO | 2006084298 A1 | 8/2006 |
| WO | 2008053140 A1 | 5/2008 |
| WO | 2009147202 | 12/2009 |
| WO | 2012172913 A1 | 12/2012 |

OTHER PUBLICATIONS

European Search Report for Application 15159617.8, report dated Oct. 19, 2015, 4 pgs.
Wheeler et al., "Use of Electron Beams in VLSI", G.E.C. Journal of Science and Technology, General Electric Company, Wembley, Middlesex, GB, vol. 48, No. 2, Jan. 1, 1982, pp. 103-107, XP000820522.
European Search Report for Application 09450211.9-1226; report dated Sep. 14, 2010, 4 pgs.
European Search Report for application 09450212.7; report dated Sep. 28, 2010, 9 pgs.
European Search Report for Application 14165967, report dated Oct. 30, 2014, 2 pgs.
European Search Report for Application 14165970, report dated Jun. 18, 2014, 2 pgs.
European Search Report for Application 14170611, report dated Nov. 4, 2014, 3 pgs.
European Search Report for Application 14176563, report dated Jan. 14, 2015, 2 pgs.
European Search Report for Application 14177851; report dated Oct. 16, 2014; 1 page.
European Search Report for Application 14199183, report dated Jun. 19, 2015, 2 pgs.
European Search Report for Application 15164770, report dated Sep. 18, 2015; 2 pgs.
European Search Report for Application 15164772, report dated Sep. 11, 2015, 2 pgs.
European Search Report for Application 15169632, report dated Oct. 20, 2015, 3 pgs.
European Search Report for Application 15171348, report dated Oct. 30, 2015, 2 pgs.
European Search Report for Application 14176645, report dated Dec. 1, 2014, 1 pg.
European Search Report for Application 08450077.6, report dated Jan. 29, 2010.
European Search Report for Application 141501197.7, report dated Jun. 6, 2014, 2 pgs.
European Search Report for Application 10450070.7, report dated May 7, 2012, 2 pgs.
Berry et al., "Programmable aperture plate for maskless high-throughput nanolithography", J. Vac. Sci. Technol., Nov./Dec. 1997, vol. B15, No. 6, pp. 2382-2386.
Borodovsky, Yan, "EUV, EBDW—ARF Replacement or Extension?", KLA—Tencor Lithography User Forum, Feb. 21, 2010, San Jose, CA, USA.
Borodovsky, Yan, "MPProcessing for MPProcessors", SEMATECH Maskless Lithography and Multibeam Mask Writer Workshop, May 10, 2010, New York, NY, USA.
Disclosed Anonymously, "Multi-tone rasterization, dual pass scan, data path and cell based vector format", IPCOM000183472D, printed from ip.com PriorArtDatabase, published May 22, 2009, 108 pages.
Kapl et al., "Characterization of CMOS programmable multi-beam blanking arrays as used for programmable multi-beam projection lithography and reisitless nanopatterning", Journal of Micromechanics and Microengineering, 21 (2001), pp. 1-8.
Li, H. Y. et al., "Through-Silicon Interposer Technology for Heterogeneous Integration", Future Fab Intl., Issue 45 (Apr. 25, 2013).
Paraskevopoulos, A. et al., "Scalable (24-140 Gbps) optical data link, well adapted for future maskless lithography applications", Proc. SPIE vol. 7271, 72711 I (2009).
Platzgummer, Elmar et al., "eMET Poc: Realization of a proof-of-concept 50 keV electron multibeam Mask Exposure Tool", Proc. of SPIE vol. 8166, 816622-1, 2011.
Platzgummer et al., "eMET-50keV electron Mask Exposure Tool Development based on proven multi-beam projection technology", Proc. of SPIE, vol. 7823, pp. 782308-1-782308-12.
Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.

* cited by examiner

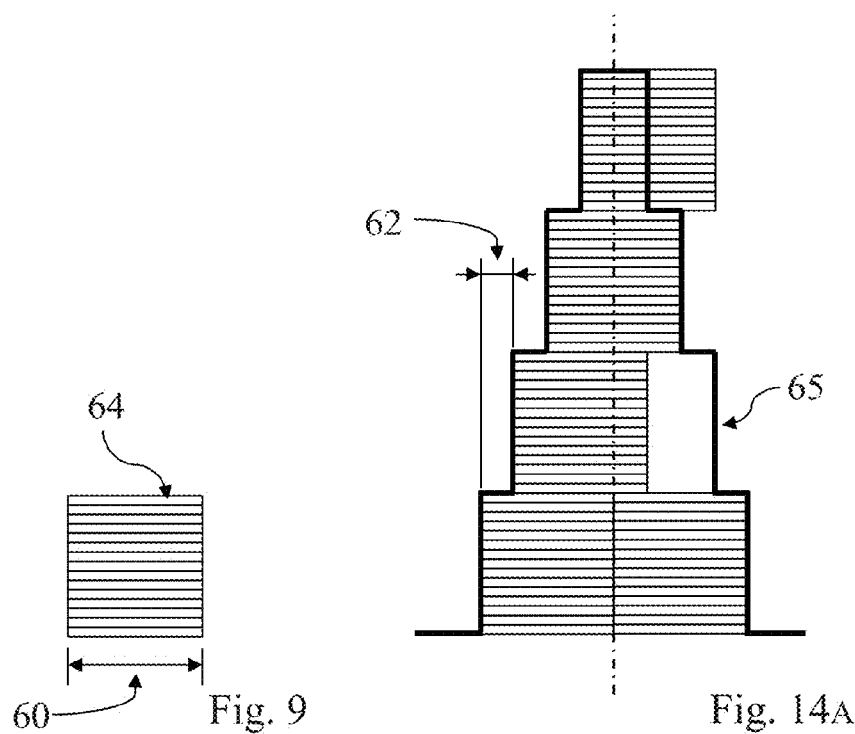
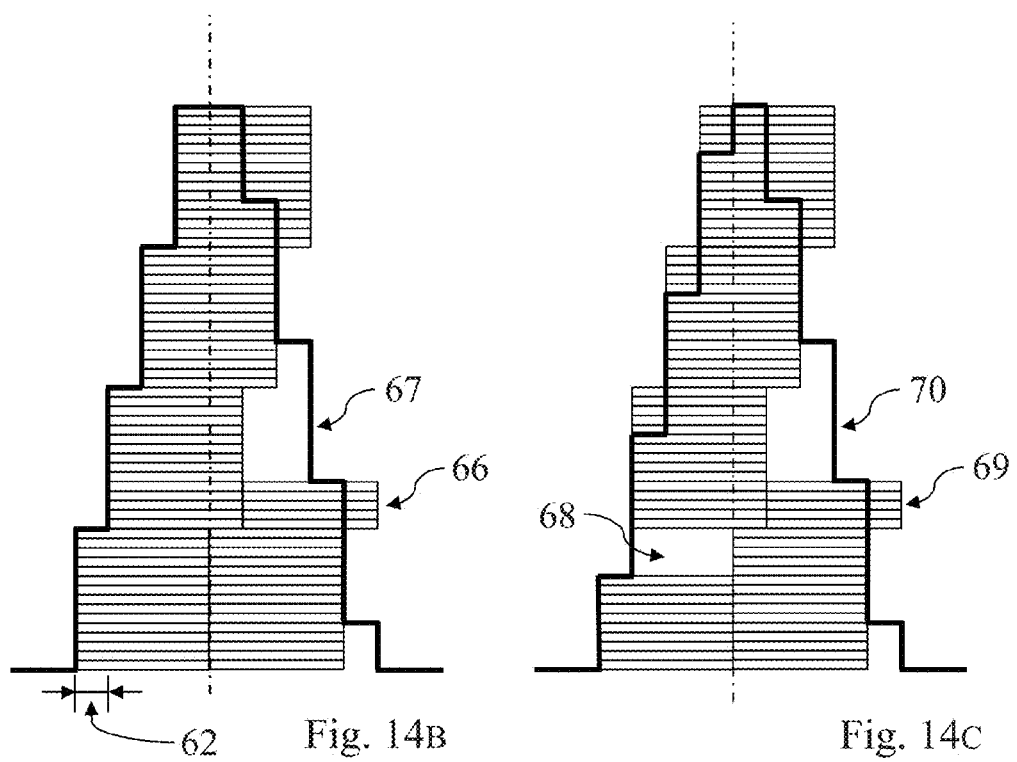

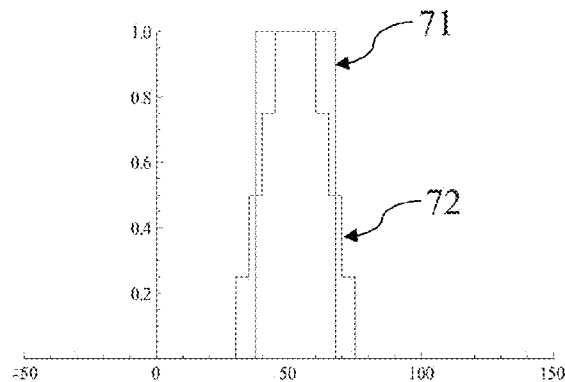
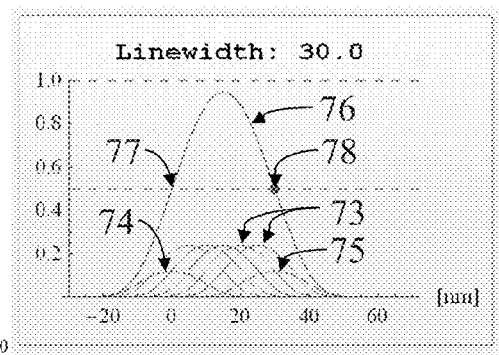
Fig. 10　　　　　　　　　　Fig. 11
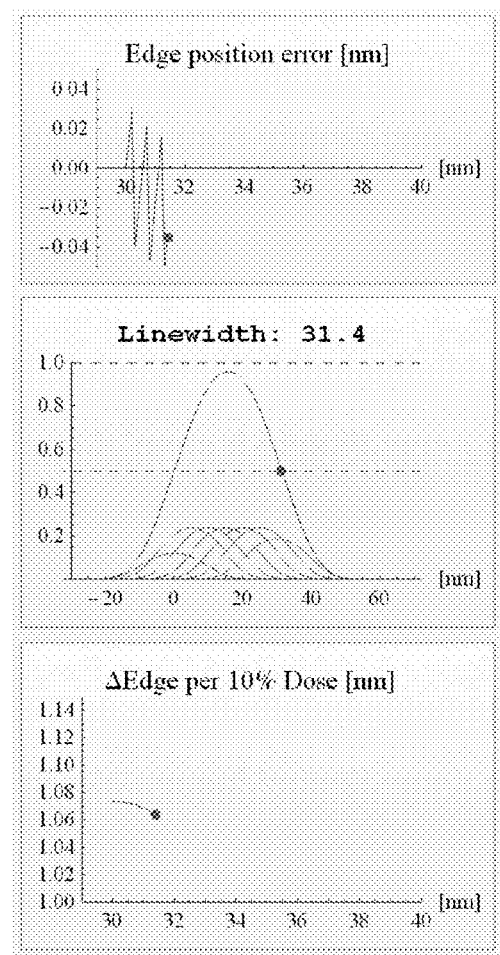
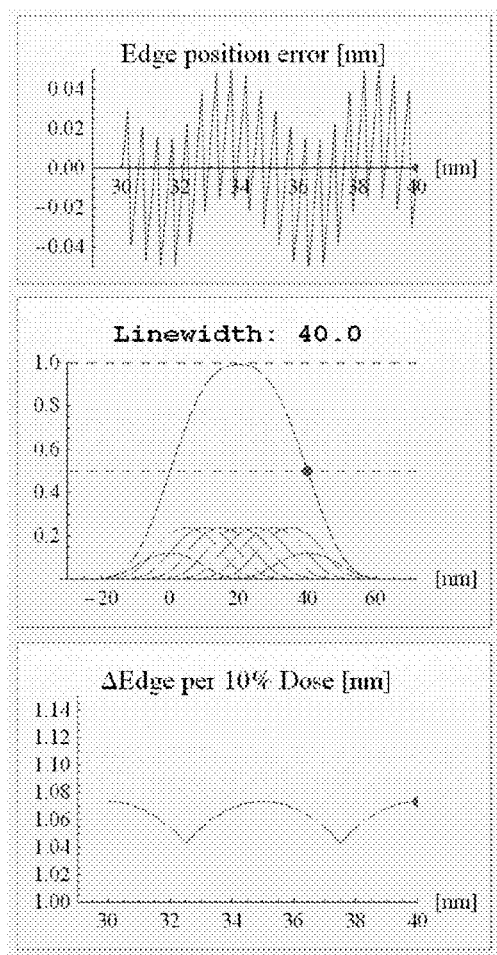
Fig. 12A　　　　　　　　　　Fig. 12B

| | | | | | | | | | | | | | | | | | | | |
|---|---|---|---|---|---|---|---|---|---|---|---|---|---|---|---|---|---|---|---|
| 0 | 0 | 0 | 0 | 0 | 0 | 0 | 0 | 5 | 5 | 5 | 5 | 5 | 5 | 0 | 0 | 0 | 0 | 0 | 0 |
| 0 | 0 | 0 | 0 | 0 | 5 | 5 | 5 | 9 | 9 | 9 | 9 | 9 | 9 | 5 | 5 | 5 | 0 | 0 | 0 |
| 0 | 0 | 0 | 0 | 5 | 5 | 9 | 9 | 14 | 14 | 14 | 14 | 14 | 14 | 9 | 9 | 5 | 5 | 0 | 0 |
| 0 | 0 | 0 | 5 | 9 | 9 | 14 | 14 | 24 | 24 | 24 | 24 | 24 | 24 | 14 | 14 | 9 | 9 | 5 | 0 |
| 0 | 0 | 5 | 9 | 9 | 14 | 24 | 24 | 61 | 61 | 61 | 61 | 61 | 61 | 24 | 24 | 14 | 9 | 5 | 0 |
| 0 | 5 | 5 | 9 | 14 | 24 | 24 | 61 | 61 | 80 | 80 | 80 | 80 | 61 | 61 | 24 | 24 | 14 | 9 | 5 |
| 0 | 5 | 9 | 14 | 24 | 24 | 61 | 80 | 80 | 108 | 108 | 108 | 108 | 80 | 80 | 61 | 24 | 24 | 14 | 9 |
| 0 | 5 | 9 | 14 | 24 | 61 | 80 | 108 | 108 | 146 | 146 | 146 | 146 | 108 | 108 | 80 | 61 | 24 | 14 | 9 |
| 5 | 9 | 14 | 24 | 61 | 61 | 80 | 108 | 146 | 165 | 165 | 165 | 165 | 146 | 108 | 80 | 61 | 24 | 14 | 9 |
| 5 | 9 | 14 | 24 | 61 | 80 | 108 | 108 | 146 | 165 | 212 | 212 | 165 | 146 | 108 | 80 | 61 | 24 | 14 | 9 |
| 5 | 9 | 14 | 24 | 61 | 80 | 108 | 146 | 165 | 212 | 240 | 240 | 212 | 165 | 146 | 108 | 80 | 61 | 24 | 14 |
| 5 | 9 | 14 | 24 | 61 | 80 | 108 | 146 | 165 | 212 | 240 | 240 | 212 | 165 | 146 | 108 | 80 | 61 | 24 | 14 |
| 5 | 9 | 14 | 24 | 61 | 80 | 108 | 146 | 165 | 212 | 212 | 212 | 165 | 146 | 108 | 80 | 61 | 24 | 14 | 9 |
| 5 | 9 | 14 | 24 | 61 | 61 | 80 | 108 | 146 | 165 | 165 | 165 | 165 | 146 | 108 | 80 | 61 | 24 | 14 | 9 |
| 0 | 5 | 9 | 14 | 24 | 61 | 80 | 108 | 108 | 146 | 146 | 146 | 146 | 108 | 108 | 80 | 61 | 24 | 14 | 9 |
| 0 | 5 | 9 | 14 | 24 | 24 | 61 | 80 | 80 | 108 | 108 | 108 | 108 | 80 | 80 | 61 | 24 | 24 | 14 | 9 |
| 0 | 5 | 5 | 9 | 14 | 24 | 24 | 61 | 61 | 80 | 80 | 80 | 80 | 61 | 61 | 24 | 24 | 14 | 9 | 5 |
| 0 | 0 | 5 | 9 | 9 | 14 | 24 | 24 | 61 | 61 | 61 | 61 | 61 | 61 | 24 | 24 | 14 | 9 | 5 | 0 |
| 0 | 0 | 0 | 5 | 9 | 9 | 14 | 14 | 24 | 24 | 24 | 24 | 24 | 24 | 14 | 14 | 9 | 9 | 5 | 0 |
| 0 | 0 | 0 | 0 | 5 | 5 | 9 | 9 | 14 | 14 | 14 | 14 | 14 | 14 | 9 | 9 | 5 | 5 | 0 | 0 |
| 0 | 0 | 0 | 0 | 0 | 5 | 5 | 5 | 9 | 9 | 9 | 9 | 9 | 9 | 5 | 5 | 5 | 0 | 0 | 0 |
| 0 | 0 | 0 | 0 | 0 | 0 | 0 | 0 | 5 | 5 | 5 | 5 | 5 | 5 | 0 | 0 | 0 | 0 | 0 | 0 |

| 0 | 0 | 0.1 | 0.5 | 1.6 | 4.3 | 9.3 | 16.2 | 22.6 | 25.3 | 22.6 | 16.2 | 9.3 | 4.3 | 1.6 | 0.5 | 0.1 | 0 | 0 |
|---|---|---|---|---|---|---|---|---|---|---|---|---|---|---|---|---|---|---|
| 0 | 0 | 0.2 | 0.7 | 2.5 | 6.9 | 14.9 | 26.0 | 36.3 | 40.6 | 36.3 | 26.0 | 14.9 | 6.9 | 2.5 | 0.7 | 0.2 | 0 | 0 |
| 0 | 0.1 | 0.3 | 1.1 | 3.8 | 10.4 | 22.6 | 39.5 | 55.1 | 61.5 | 55.1 | 39.5 | 22.6 | 10.4 | 3.8 | 1.1 | 0.3 | 0.1 | 0 |
| 0 | 0.1 | 0.4 | 1.6 | 5.5 | 14.9 | 32.5 | 56.6 | 79.0 | 88.3 | 79.0 | 56.6 | 32.5 | 14.9 | 5.5 | 1.6 | 0.4 | 0.1 | 0 |
| 0 | 0.1 | 0.5 | 2.2 | 7.5 | 20.3 | 44.1 | 76.8 | 107.2 | 119.8 | 107.2 | 76.8 | 44.1 | 20.3 | 7.5 | 2.2 | 0.5 | 0.1 | 0 |
| 0 | 0.1 | 0.7 | 2.8 | 9.6 | 26.0 | 56.6 | 98.7 | 137.7 | 153.9 | 137.7 | 98.7 | 56.6 | 26.0 | 9.6 | 2.8 | 0.7 | 0.1 | 0 |
| 0 | 0.2 | 0.8 | 3.4 | 11.6 | 31.6 | 68.8 | 119.8 | 167.3 | 186.9 | 167.3 | 119.8 | 68.8 | 31.6 | 11.6 | 3.4 | 0.8 | 0.2 | 0 |
| 0 | 0.2 | 0.9 | 3.9 | 13.4 | 36.3 | 79.0 | 137.7 | 192.2 | 214.8 | 192.2 | 137.7 | 79.0 | 36.3 | 13.4 | 3.9 | 0.9 | 0.2 | 0 |
| 0 | 0.2 | 1.0 | 4.3 | 14.5 | 39.5 | 85.9 | 149.7 | 208.9 | 233.4 | 208.9 | 149.7 | 85.9 | 39.5 | 14.5 | 4.3 | 1.0 | 0.2 | 0 |
| 0 | 0.2 | 1.0 | 4.4 | 14.9 | 40.6 | 88.3 | 153.9 | 214.8 | 240.0 | 214.8 | 153.9 | 88.3 | 40.6 | 14.9 | 4.4 | 1.0 | 0.2 | 0 |
| 0 | 0.2 | 1.0 | 4.3 | 14.5 | 39.5 | 85.9 | 149.7 | 208.9 | 233.4 | 208.9 | 149.7 | 85.9 | 39.5 | 14.5 | 4.3 | 1.0 | 0.2 | 0 |
| 0 | 0.2 | 0.9 | 3.9 | 13.4 | 36.3 | 79.0 | 137.7 | 192.2 | 214.8 | 192.2 | 137.7 | 79.0 | 36.3 | 13.4 | 3.9 | 0.9 | 0.2 | 0 |
| 0 | 0.2 | 0.8 | 3.4 | 11.6 | 31.6 | 68.8 | 119.8 | 167.3 | 186.9 | 167.3 | 119.8 | 68.8 | 31.6 | 11.6 | 3.4 | 0.8 | 0.2 | 0 |
| 0 | 0.1 | 0.7 | 2.8 | 9.6 | 26.0 | 56.6 | 98.7 | 137.7 | 153.9 | 137.7 | 98.7 | 56.6 | 26.0 | 9.6 | 2.8 | 0.7 | 0.1 | 0 |
| 0 | 0.1 | 0.5 | 2.2 | 7.5 | 20.3 | 44.1 | 76.8 | 107.2 | 119.8 | 107.2 | 76.8 | 44.1 | 20.3 | 7.5 | 2.2 | 0.5 | 0.1 | 0 |
| 0 | 0.1 | 0.4 | 1.6 | 5.5 | 14.9 | 32.5 | 56.6 | 79.0 | 88.3 | 79.0 | 56.6 | 32.5 | 14.9 | 5.5 | 1.6 | 0.4 | 0.1 | 0 |
| 0 | 0.1 | 0.3 | 1.1 | 3.8 | 10.4 | 22.6 | 39.5 | 55.1 | 61.5 | 55.1 | 39.5 | 22.6 | 10.4 | 3.8 | 1.1 | 0.3 | 0.1 | 0 |
| 0 | 0 | 0.2 | 0.7 | 2.5 | 6.9 | 14.9 | 26.0 | 36.3 | 40.6 | 36.3 | 26.0 | 14.9 | 6.9 | 2.5 | 0.7 | 0.2 | 0 | 0 |
| 0 | 0 | 0.1 | 0.5 | 1.6 | 4.3 | 9.3 | 16.2 | 22.6 | 25.3 | 22.6 | 16.2 | 9.3 | 4.3 | 1.6 | 0.5 | 0.1 | 0 | 0 |

COMPENSATION OF IMAGING DEVIATIONS IN A PARTICLE-BEAM WRITER USING A CONVOLUTION KERNEL

CROSS REFERENCE TO RELATED APPLICATIONS

This application claims priority to U.S. Provisional Application No. 62/094,372 filed on Dec. 19, 2014, European Application No. 14199183.6 filed on Dec. 19, 2014, and European Application No. 14176563.6 filed on Jul. 10, 2014, the disclosures of which are hereby incorporated by reference in their entireties.

FIELD OF THE INVENTION AND DESCRIPTION OF PRIOR ART

Embodiments of the invention relate to a charged-particle multi-beam processing apparatus for forming a pattern on a surface of a substrate or target by means of a beam of energetic electrically charged particles and for calculating patterns to be generated on a target with such processing apparatus. More in detail, in many embodiments, the invention relates to a method for computing an exposure pattern for exposing a desired pattern on a target in a charged-particle multi-beam processing apparatus, in which a particle beam is directed to and illuminates a pattern definition device comprising an aperture array composed of a plurality of blanking apertures through which said particle beam penetrates for writing said desired pattern by exposing a multitude of pixels within an image area on the target, wherein in the pattern definition device said plurality of blanking apertures is arranged in a predetermined arrangement defining mutual positions of the blanking apertures, each blanking aperture being selectively adjustable with regard to a dose value to be exposed through the respective blanking aperture onto a corresponding aperture image generated on the target during a respective exposure interval, said dose value taking a respective value selected from a discrete gray scale, wherein during a writing process of said desired pattern, a sequence of exposure intervals is made, wherein in each exposure interval the blanking apertures are imaged onto the target, thus generating a corresponding plurality of aperture images. Furthermore, in many embodiments, the invention relates to a charged-particle multi-beam processing apparatus for exposure of a target by means of a structured beam of electrically charged particles, configured to employ a method of the mentioned kind.

Charged-particle multi-beam processing apparatuses of the above-described type are well-known in prior art. In particular, the applicant has realized charged-particle multi-beam devices as described in several patents in the name of the applicant with respect to the charged-particle optics, pattern definition (PD) device, and multi-beam writing methods employed therein. For instance, a 50 keV electron multi-beam writer which allows to realize leading-edge complex photomasks for 193 nm immersion lithograph, of masks for EUV lithography and of templates (1× masks) for imprint lithography, has been implemented, called eMET (electron Mask Exposure Tool) or MBMW (multi-beam mask writer), for exposing 6" mask blank substrates. Moreover, a multi-beam system also referred to as PML2 (Projection Mask-Less Lithography) was implemented for electron beam direct write (EBDW) applications on Silicon wafer substrates. Multi-beam processing apparatuses of the said kind are hereinafter referred to as multi-beam writer, or short MBW.

As a typical implementation of an MBW, the applicant has realized a 50 keV electron writer tool implementing a total beam size of 20 nm comprising 512×512 (=262,144) programmable beamlets within a beam array field of dimensions 81.92 μm×81.92 μm at the substrate. In this system, which is referred to as "MBMW tool" hereinafter, the substrate is, typically, a 6" mask blank (having an area of 6"×6"=152.4 mm×152.4 mm and thickness 6"/4=6.35 mm) covered with an electron beam sensitive resist; furthermore, multi-beam writing is possible on resist-covered 150 mm Si wafers as well.

The current density of a typical MBW, such as the MBMW tool, is no higher than 1 A/cm$^2$ when using 20 nm beam size. Thus, when all programmable 262,144 beamlets are "on" the maximum current is 1.05 μA. In this implementation the 1 sigma blur of the MBW column is approx. 5 nm, as verified experimentally.

There is the possibility to change the beam size, e.g., from 20 nm to 10 nm. For a column with 200:1 reduction this is straightforward by using a different aperture array plate (AAP), with 2 μm×2 μm opening size of the apertures instead of 4 μm×4 μm opening size. As outlined in U.S. Pat. No. 8,546,767 of the applicant, a change of the beam size may also be realized in-situ by spatial adjustment of the AAP having multiple aperture arrays of different geometric parameters, such a total size, aperture spacing, aperture shapes etc.

When using a 10 nm beam size and providing a current density at the substrate of no higher than 4 A/cm$^2$, the current of 262,144 programmable beamlets (with all beamlets "on") is again 1.05 μA at maximum. Thus, also in this case there is virtually no change of the 1 sigma blur of the column with current through the column.

The first generation MBW production machines are targeted to use 20 nm and 10 nm beams providing up to approx. 1 μA current for all 262,144 programmable beams "on". For following generations of MBW production machines there is the plan to use even smaller beam size, for instance of 8 nm, and concurrently to provide e.g. 640×640=409,600 beamlets within the 81.92 μm×81.92 μm beam array field at the substrate. Keeping the maximum current density at 4 A/cm$^2$ will ensure that the maximum current (with all beamlets "on") is 1.05 μA. For instance, using a 5 nm beam size allows providing e.g. 1024×1024=1,048,576 programmable beams within the mentioned beam array field at the substrate; again, at a maximum current density of 4 A/cm$^2$ the maximum current (with all beamlets "on") is 1.05 μA.

For industrial applications, very demanding MBW performance requirements are imposed with respect to achieving a small Critical Dimension (CD) and, in particular, to achieving 3sigma or 6sigma variations at a nanometer level of the Local CD Uniformity (LCDU) within small fields (e.g. the area of the MBW beam array field) as well as nanometer level 3sigma or 6sigma variations of the Global CD Uniformity (GCDU) over the whole MBW writing field on a substrate (e.g. a 6" mask blank or a 300 mm Silicon wafer).

Furthermore, it is desired to fine-adjust the line edge position by means of a specifically adapted exposure dose profile. Furthermore, such a fine-adjustment should not only be adaptable within the MBW beam array field (local) but also over the whole MBMW writing field on a substrate (global).

Using the MBW architecture of the applicant, low CD values can be achieved and small LCDU and GCDU values. However, in order to fulfill the very demanding MBW specifications of very low LCDU and GCDU values, there is the need for additional fine corrections. Here, the terms "local" and "global" refer again to small fields (e.g. the area of the MBW beam array field) and the whole MBW writing field on a substrate, respectively.

SUMMARY OF THE INVENTION

According to one embodiment of the invention, a method is proposed for computing an exposure pattern for exposing a desired pattern on a target in a charged-particle multi-beam processing apparatus, wherein starting from a method as described in the beginning of this disclosure the method comprises the following steps:
i) providing the desired pattern as a graphical representation on the image area on the target, said graphical representation having a predetermined width of resolution, where the width of resolution is usually larger than a nominal distance between neighboring positions of the pixels within said image area,
ii) providing a convolution kernel, said kernel describing a mapping from an element of the graphical representation to a group of pixels, said group of pixels being centered around a nominal position of said element,
iii) calculating a nominal exposure pattern as a pixel raster graphics defined on the multitude of pixels, by convolution of the graphical representation with the convolution kernel, said nominal exposure pattern being suitable to create a nominal dose distribution on the target; the nominal dose distribution may emulate a desired intensity distribution or may serve to realize contour lines of the desired pattern.

The nominal exposure pattern thus generated may suitably include for each pixel a respective nominal dose value $P°$. It is remarked that steps i and ii may be performed in any relative temporal order.

In accordance with one embodiment of the invention, the convolution kernel can be used as a "Matching Convolution Kernel" (MCK) for correcting deviations in the imaging from the pattern definition device to the target, in particular deviations which concern a desired value of critical dimension along at least one direction in the image area on the target. The implementation of a convolution with an MCK according to certain embodiments of the invention offers a simple approach to compensate deviations of this kind. Different types and designs of MCKs, as well as their impact on the CD, are described in detail in this disclosure.

A variant aspect of the invention, which is dealt with in a separate application, includes an approach for adapting a multi-beam writer device of known type with respect to its data path, enabling to use a reference tool data file as data input while employing a multi-beam writer device, such as one of the eMET/MBMW/PML2 apparatuses described above, to realize the pattern in the desired quality of CD (critical dimension), CDU (CD uniformity), pattern fidelity while also meeting the registration (placement) specifications. This variant enables processing of a substrate (such as a 6" mask or Silicon wafer) with the multi-beam writer device within reduced time compared to the processing time needed with the reference tool, e.g. VSB mask writer.

Many embodiments of the invention can be used to improve the result of the multi-beam writer device by using metrology feedback, for example, to calibrate out a different line width and/or scale in X and Y directions of patterns written with the multi-beam writer device. Similarly, the kernel of many embodiments of the invention can be used to enhance specific pattern types, e.g. contact holes (typically square or round patterns) by using a specific convolution kernel that relates to the size of the to-be-modified feature.

Another aspect of certain embodiments of the invention relates to a charged-particle multi-beam processing apparatus for exposure of a target by means of a structured beam of electrically charged particles, comprising an illumination system, a pattern definition device and a projection optics system, where the illumination system is configured to produce a beam of said electrically charged particles and form it into a wide beam illuminating the pattern definition device; the pattern definition device being configured to form the shape of the illuminating beam into a structured beam composed of a multitude of sub-beams, and the projection optics system being configured to project an image of the beam shape defined in the pattern definition device onto the target, thus exposing a multitude of pixels within an image area on the target, wherein the pattern definition device comprises an aperture array composed of a plurality of blanking apertures forming said sub-beams, said plurality of blanking apertures being arranged in a predetermined arrangement defining mutual positions of the blanking apertures, each blanking aperture being selectively adjustable with regard to a dose value to be exposed through the respective blanking aperture onto a corresponding aperture image generated on the target during a respective exposure interval, said dose value taking a respective value selected from a discrete gray scale, wherein during a writing process of said desired pattern, a sequence of exposure intervals is made, wherein in each exposure interval the blanking apertures are imaged onto the target, thus generating a corresponding plurality of aperture images. The processing apparatus is, according to several embodiments of the invention, configured for performing a writing process for a desired pattern using the method of certain embodiments of the invention to convert the desired pattern into a nominal exposure pattern writable with the processing apparatus, wherein the convolution kernel is configured to compensate a deviation of the imaging from the pattern definition device to the target, said deviation concerning a desired value of critical dimension along at least one direction in the image area on the target. Alternatively or in combination, the processing apparatus may also be configured for emulating a writing process for a desired pattern in a reference writing apparatus, said reference writing apparatus having a point spreading function having a width of resolution larger than a nominal width of the aperture images generated by the processing apparatus, using the method of certain embodiments of the invention to convert the desired pattern into a nominal exposure pattern which can be written with the processing apparatus.

In a suitable embodiment of the invention which allows a finer control of the placement of pattern features to be produced, the writing process generates aperture images which are mutually overlapping, and the aperture images have a nominal width which is a multiple of the distance (by a factor o greater than one, in a typical case an integer factor) between pixel positions of neighboring aperture images generated on the target, the method having the additional step of:
iv) generating, from the nominal exposure pattern, an exposure pattern suitable to expose the desired pattern by said writing process through exposure of aperture images.

In a typical application of an embodiment of the invention, the graphical representation in step i is a raster graphics on a reference raster having a raster width, said raster width being used as width of resolution. Alternatively, the graphical representation may be a vector graphics which is then converted to a raster graphics on a reference raster having a raster width which is preferably larger than a nominal distance between neighboring positions of the pixels within said image area.

According to a suitable aspect of certain embodiments of the invention, the calculations of step iii, and (where present) subsequent calculations, are performed during a writing process in real time, performing associated calculations transiently without permanently storing the calculated data.

In yet another advantageous realization the convolution kernel may represent a point spreading function of a reference writing apparatus to be emulated by means of said processing apparatus. Typically, the point spreading function of the processing apparatus itself can often be neglected in this context since it is much smaller than that of the reference writing apparatus.

One suitable representation of the convolution kernel is in the form of a discrete matrix of pixel values. Thus, the convolution in step iii may be performed as discrete convolution, i.e., over the discrete elements of the matrix.

Another aspect of a number of embodiments of the invention realizes a convolution kernel which is anisotropic with regard to two main directions on the image area. This enables suitable handling of elliptical point spread function or other anisotropies, in order to emulate and/or compensate such anisotropic behavior of a reference tool. In particular, the convolution kernel may be anisotropic with regard to critical dimensions along the two main directions on the image area as generated during imaging the blanking apertures onto the target. As a further advantageous application, the anisotropy of the kernel may be used for compensating an anisotropy of imaging the blanking apertures onto the target, with respect to the multi-beam writer and/or the reference tool to be emulated.

Furthermore, the convolution kernel may also include time-dependent values. In such a case, the function and/or numbers characterizing the convolution kernel are not constant but change in time. A typical application of such a time-dependency is, e.g., the emulation of a time-dependent writing behavior of a specific reference writing apparatus. For instance, the time-dependent values may comprise a time dependence corresponding to an ageing function of the sensitivity of the target, such as a charged-particle beam sensitive resist layer present on the target. As a further example, alternatively or in combination, where the particle beam is generated from a source generating a particle current which may vary in time, the time-dependency may comprise a function corresponding to a fluctuation function of the total current emitted from the source. Another example for the application of a time-dependent MCK is the emulation of a charged particle beam, which in the time between recalibration cycles of the writing apparatus, typically loses its precision over time.

In another advantageous development, several embodiments of the invention employ two or more convolution kernels. For instance, based on a predefined partition of the area of the aperture array into a plurality of sub-areas, two or more different convolution kernels are used, where each sub-area among said plurality of sub-areas is associated with one of the kernels, which is used in the respective subarea. Alternatively or in combination, each kernel may be used on a respective sub-area among a plurality of sub-areas within the image area, which may be useful in order to consider differences in the point spreading function across the image field (e.g. the blur may vary across the image field). Also, it is possible that a plurality of aperture array is present in the pattern definition device, which are used at different stages of the writing process, and then for each aperture array an associated kernel is used.

Advantageously, the calculation may be done at a higher data precision than the data used in the actual writing process, such as the gray scale data. In this case the convolution in step iii may be performed using arithmetic values which have an arithmetic precision higher than the resolution of the discrete gray scale.

Furthermore, the width of resolution of the graphical representation may be larger than a nominal width of the aperture images generated by the charged-particle multi-beam processing apparatus. Moreover, in a preferred realization of the writing process underlying several embodiments of the invention, the position of aperture images is kept fixed relative to the target at the position of a pixel during an exposure interval, but between exposure intervals the position of aperture images is shifted over the target, thus exposing the multitude of pixels within said image area on the target.

BRIEF DESCRIPTION OF THE DRAWINGS

In the following, the embodiments of the present invention are described in more detail with reference to the drawings, which schematically show:

FIG. 8a: "Double Grid", FIG. 8b: "Quad Grid", and FIG. 8c: "Double-Centered Grid";

FIG. 9 illustrate the intensity profile which is generated when one single exposure spot is exposed with a maximum dose;

FIG. 10 illustrates an intensity profile of the MBW of the type shown in FIG. 1, and a dose level profile for a 30 nm line;

FIG. 11 shows an intensity profile for the 30 nm line dose level profile of FIG. 10;

FIGS. 12A and 12B illustrate MBW intensity profiles and related data as obtained for a simulation of a line, with a line width of 31.4 nm (FIG. 12A) and 40.0 nm (FIG. 12B), respectively.

FIG. 14A illustrates the intensity profile generated from the exposure of a line of a determined width;

FIGS. 14B,C illustrate the fine adjustment of the position of one edge (FIG. 14B) or both edges (FIG. 14C) of the line of FIG. 14A via suitable modifications of the dose levels corresponding the exposure spots;

FIG. 15A shows the effect of increasing the intensity distribution by 4%, leading to a line edge shift of 0.43 nm, whereas

FIG. 31 shows the kernel of FIG. 30 in a matrix representation;

FIGS. 32A-C illustrate the convolution of an intensity profile given as a matrix array (FIG. 32A) with the kernel (FIG. 32B), determining the intensity of the spot $P^o_{i,j}$ (FIG. 32c);

DETAILED DESCRIPTION

The embodiment of the invention discussed below implements a "Matching Convolution Kernel", short MCK or simply "kernel", which is used in the on-line data path of a multi-beam exposure tool of the applicant of basically known type, but with suitable modifications so as to accommodate embodiments of the invention as described below. It should be appreciated that the invention is not restricted to the embodiments discussed in the following, which merely represent suitable implementations of the invention.

Lithographic Apparatus

Figure 1:
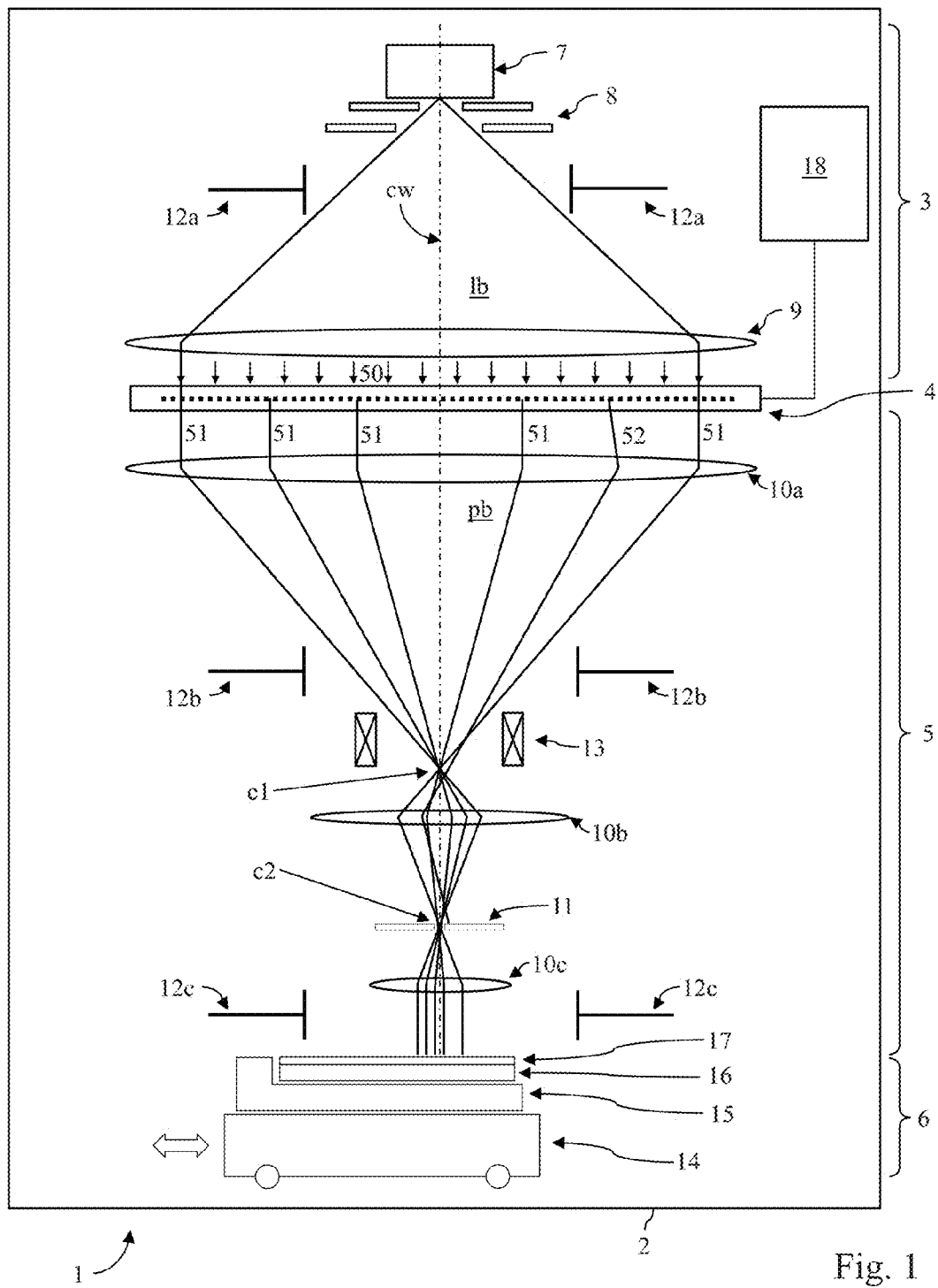
FIG. 1 a MBW system of state of the art in a longitudinal sectional view.

An overview of a lithographic apparatus suitable to employ the preferred embodiment of the invention is shown in FIG. 1. In the following, only those details are given as needed to disclose certain embodiments of the invention such that one of ordinary skill in the art can practice the various embodiments of the invention; for the sake of clarity, the components are not shown to size in FIG. 1. The main components of the lithography apparatus 1 are—corresponding to the direction of the lithography beam lb, pb which in this example runs vertically downward in FIG. 1—an illumination system 3, a pattern definition (PD) system 4, a projecting system 5, and a target station 6 with the substrate 16. The whole apparatus 1 is contained in a vacuum housing 2 held at high vacuum to ensure an unimpeded propagation of the beam lb, pb of charged particles along the optical axis cw of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the source 7 are formed into a broad, substantially telecentric particle beam 50 serving as lithography beam lb. The lithography beam lb then irradiates a PD system 4 which comprises a number of plates with a plurality of openings (also referred to as apertures). The PD system 4 is held at a specific position in the path of the lithography beam lb, which thus irradiates the plurality of apertures and/or openings and is split into a number of beamlets.

Some of the apertures/openings are "switched on" or "open" so as to be transparent to the incident beam in the sense that they allow the portion of the beam that is transmitted through it, i.e. the beamlets 51, to reach the target; the other apertures/openings are "switched off" or "closed", i.e. the corresponding beamlets 52 cannot reach the target, and thus effectively these apertures/openings are non-transparent (opaque) to the beam. Thus, the lithography beam lb is structured into a patterned beam pb, emerging from the PD system 4. The pattern of switched on apertures—the only portions of the PD system 4 which are transparent to the lithography beam lb—is chosen according to the pattern to be exposed on the substrate 16 covered with charged-particle sensitive resist 17. It has to be noted that the "switching on/off" of the apertures/openings is usually realized by a suitable type of deflection means provided in one of the plates of the PD system 4: "Switched off" beamlets 52 are deflected off their path (by sufficient albeit very small angles) so they cannot reach the target but are merely absorbed somewhere in the lithography apparatus, e.g. at an absorbing plate 11.

The pattern as represented by the patterned beam pb is then projected by means of an electro-magneto-optical projection system 5 onto the substrate 16 where the beam forms an image of the "switched-on" apertures and/or openings. The projection system 5 implements a demagnification of, for instance, 200:1 with two crossovers c1 and c2. The substrate 16 is, for instance, a 6" mask blank or a silicon wafer covered with a particle sensitive resist layer 17. The substrate is held by a chuck 15 and positioned by a substrate stage 14 of the target station 6.

The information regarding the pattern to be exposed is supplied to the PD system 4 by the data path realized by means of an electronic pattern information processing system 18. The data path is explained further below in section "Datapath".

In the embodiment shown in FIG. 1, the projection system 5 is composed of a number of consecutive electro-magneto-optical projector stages 10a, 10b, 10c, which preferably include electrostatic and/or magnetic lenses, and possibly other deflection means. These lenses and means are shown in symbolic form only, since their application is well known in the prior art. The projection system 5 employs a demagnifying imaging through crossovers c1, c2. The demagnification factor for both stages is chosen such that an overall demagnification of several hundred results, e.g. 200:1 reduction. A demagnification of this order is in particular suitable with a lithography setup, in order to alleviate problems of miniaturization in the PD device.

In the whole projection system 5, provisions are made to extensively compensate the lenses and or deflection means with respect to chromatic and geometric aberrations. As a means to shift the image laterally as a whole, i.e. along a direction perpendicular to the optical axis cw, deflection means 12a, 12b and 12c are provided in the condenser 3 and projection system 5. The deflection means may be realized as, for instance, a multipole electrode system which is either positioned near the source extraction system 12a or one of the crossovers, as shown in FIG. 1 with the deflection means 12b, or after the final lens 10c of the respective projector, as in the case with the stage deflection means 12c in FIG. 1. In this apparatus, a multipole electrode arrangement is used as deflection means both for shifting the image in relation to the stage motion and for correction of the imaging system in conjunction with the charge-particle optics alignment system. These deflection means 10a, 10b, 10c are not to be confused with the deflection array means of the PD system 4 in conjunction with the stopping plate 11, as the latter are used to switch selected beamlets of the patterned beam pd "on" or "off", whereas the former only deal with the particle beam as a whole. There is also the possibility to rotate the ensemble of programmable beams using a solenoid 13 providing an axial magnetic field.

Figures 2, 6A, 6B:
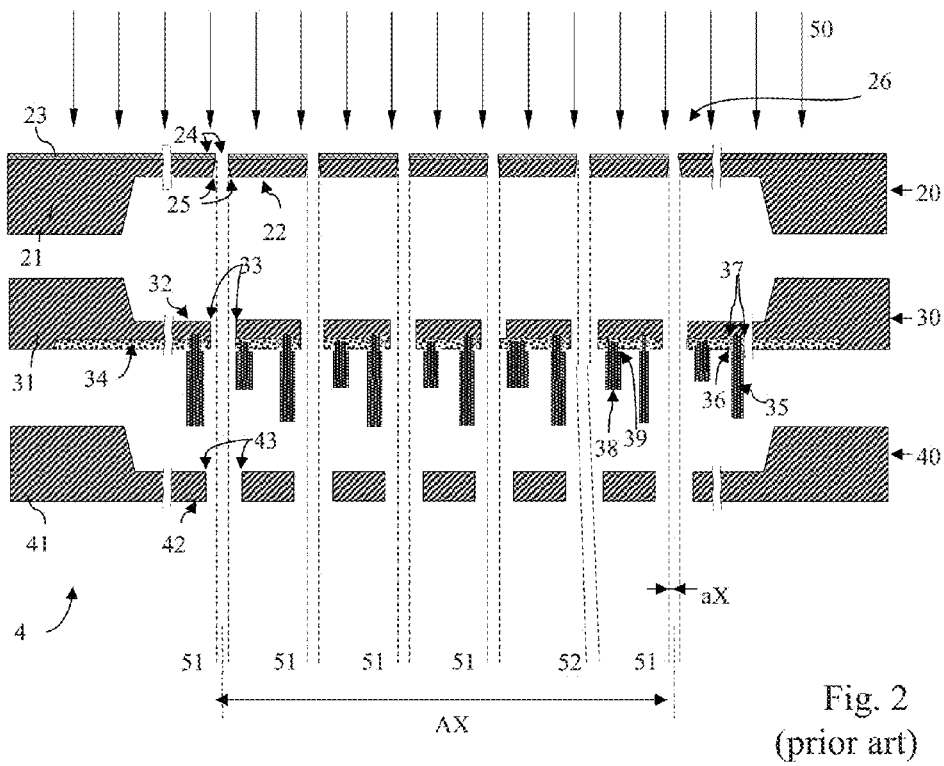
FIG. 2 a pattern definition system state of the art in a longitudinal section.
FIG. 6A illustrates an arrangement of apertures with M=2, N=2.
FIG. 6B shows an example of oversampling of the pixels in a "double grid" arrangement.

The sectional detail of FIG. 2 illustrates one suitable embodiment of a PD system 4, which comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction (vertical axis in FIG. 2).

The flat upper surface of AAP 20 forms a defined potential interface to the charged-particle condenser optics/illumination system 3. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (line in U.S. Pat. No. 6,858,118). When using electrons or heavy ions (e.g. argon or xenon), the layer 23 may also be of silicon provided by the surface section of 21 and 22, respectively, so that there is no interface between layer 23 and the bulk parts 21, 22.

Figure 4:
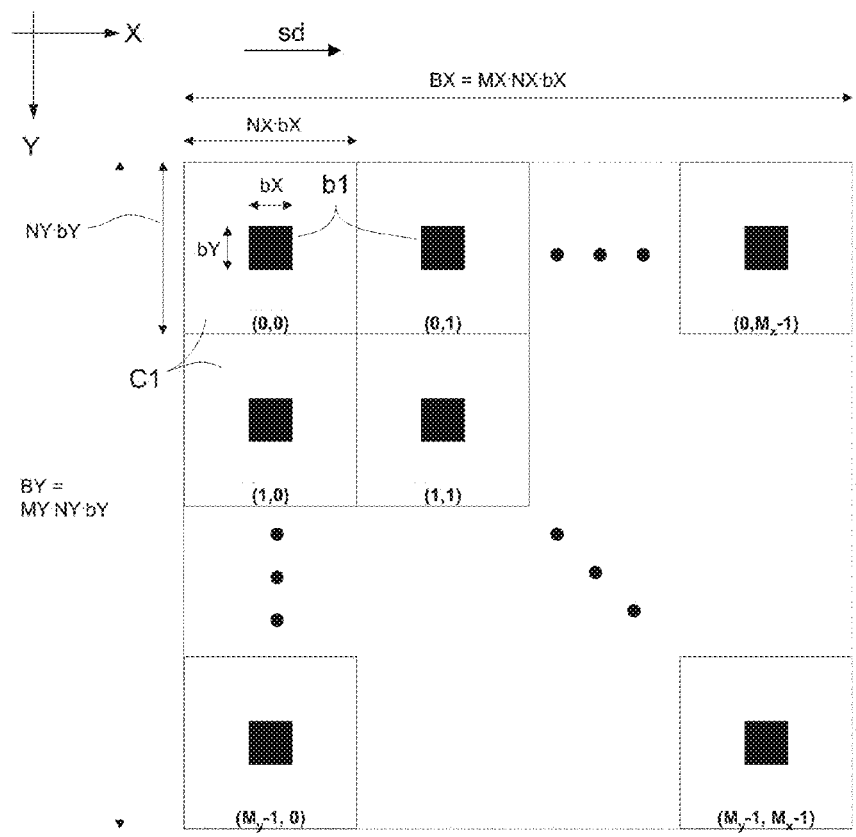
FIG. 4 shows an exemplary arrangement of apertures as imaged onto the target.

The AAP 20 is provided with a plurality of apertures 24 formed by openings traversing the thinned part 22. The apertures 24 are arranged in a predetermined arrangement within an aperture area provided in the thinned part 22, thus forming an aperture array 26. The arrangement of the apertures in the aperture array 26 may be, for instance, a staggered arrangement or a regular rectangular or square array (cf. FIG. 4). In the embodiment shown, the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual beamlets passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to 24 (by approx. 2 μm at each side for instance). CMOS electronics 34 is provided to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding beamlet, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beamlets.

The arrangement of a PD system 4 with a DAP 30 shown in FIG. 2 is only one of several possibilities. In a variant (not shown) the ground and deflection electrodes 35, 38 of the DAP may be oriented upstream (facing upward), rather than downstream. Further DAP configurations, e.g. with embedded ground and deflection electrodes, can be devised by the skilled person (see other patents in the name of the applicant, such as U.S. Pat. No. 8,198,601 B2).

The third plate 40 serving as FAP has a flat surface facing to the first lens part of the down-stream demagnifying charged-particle projection optics 5 and thus provides a defined potential interface to the first lens 10a of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate of it, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beamlets 51 when transmitted through the apertures 24. The beamlets 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beamlet 52 passing through (FIG. 2). The deflected beamlet can traverse the DAP and FAP unhindered as the openings 33 and 43, respectively, are made sufficiently wide. However, the deflected beamlet 52 is filtered out at the stopping plate 11 of the sub-column (FIG. 1). Thus, only those beamlets which are unaffected by the DAP will reach the substrate.

The reduction factor of the demagnifying charged-particle optics 5 is chosen suitably in view of the dimensions of the beamlets and their mutual distance in the PD device 4 and the desired dimensions of the structures at the target. This will allow for micrometer-sized beamlets at the PD system whereas nanometer-sized beamlets are projected onto the substrate.

The ensemble of (unaffected) beamlets 51 as formed by AAP is projected to the substrate with a predefined reduction factor R of the projection charged-particle optics. Thus, at the substrate a "beam array field" (BAF) is projected having widths BX=AX/R and BY=AY/R, respectively, where AX and AY denote the sizes of the aperture array field along the X and Y directions, respectively. The nominal width of a beamlet at the substrate (i.e. aperture image) is given by bX=aX/R and bY=aY/R, respectively, where aX and aY denote the sizes of the beamlet 51 as measured along the X and Y directions, respectively, at the level of the DAP 30.

It is worthwhile to note that the individual beamlets 51, 52 depicted in FIG. 2 represent a much larger number of beamlets, typically many thousands, arranged in a two-dimensional X-Y array. The applicant has, for instance, realized multi-beam charged-particle optics with a reduction factor of R=200 for ion as well as electron multi-beam columns with many thousands (e.g., 262,144) programmable beamlets. The applicant has realized such columns with a BAF of approx. 82 µm×82 µm at the substrate. These examples are stated for illustrative purpose, but are not to be construed as limiting examples.

Figure 3:
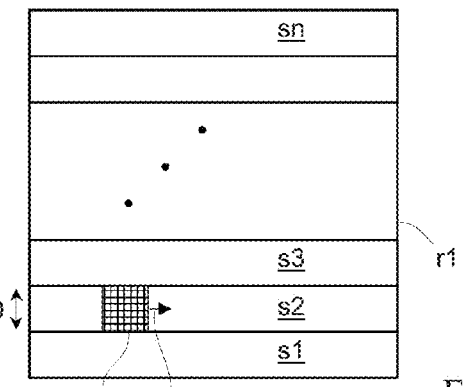
FIG. 3 illustrates the basic writing strategy on the target using stripes.

Referring to FIG. 3, a pattern image pm as defined by the PD system 4 is produced on the target 16. The target surface covered with the charged-particle sensitive resist layer 17 will comprise one or more areas r1 to be exposed. Generally, the pattern image pm exposed on the target has a finite size y0 which is usually well smaller than the width of the area r1 which is to be patterned. Therefore, a scanning stripe exposure strategy is utilized, where the target is moved under the incident beam, so as to change the position of the beam on the target perpetually: the beam is effectively scanned over the target surface. It is emphasized that for the purpose of many embodiments of the invention only the relative motion of the pattern image pm on the target is relevant. By virtue of the relative movement the pattern image pm is moved over the area r1 so as to form a sequence of stripes s1, s2, s3, . . . sn (exposure stripes). of width y0. The complete set of stripes covers the total area of the substrate surface. The scanning direction sd may be uniform or may alternate from one stripe to the next.

Figure 5:
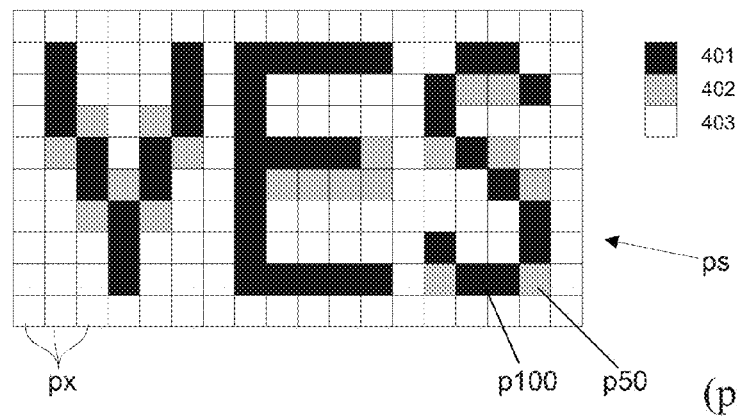
FIG. 5 shows an example of a pixel map of an exemplary pattern to be exposed.

FIG. 5 shows a simple example of an imaged pattern ps with a size of 10×16=180 pixels, where some pixels p100 of the exposure area are exposed to a gray level 401 of 100% and other pixels p50 are exposed 402 to only 50% of the full gray level. The remaining pixels are exposed to a 0% dose 403 (not exposed at all). Of course, in a realistic application of numerous embodiments of the invention, the number of pixels of the standard image would be much higher. However, in FIG. 5 the number of pixels is only 180 for the better clarity. Also, in general, much more gray levels will be used within the scale from 0% to 100%.

Thus, the pattern image pm (FIG. 3) is composed of a plurality of pattern pixels px, which are exposed with dose values according to the desired pattern to be exposed. It should be appreciated, however, that only a subset of the pixels px can be exposed simultaneously since only a finite number of apertures is present in the aperture field of the PD system. The pattern of switched-on apertures is chosen according to the pattern to be exposed on the substrate. Thus, in an actual pattern not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target.

While the substrate 16 is moved continuously, the same image element corresponding to a pattern pixel px on the target may be covered many times by the images of a sequence of apertures. Simultaneously, the pattern in the PD system is shifted, step by step, through the apertures of the PD system. Thus, considering one pixel at some location on the target, if all apertures are switched on when they cover that pixel, this will result in the maximum exposure dose level: a "white" shade corresponding to 100%. In addition to a "white" shade, it is possible to expose a pixel at the target according to a lower dose level (also dubbed 'gray shade') which would interpolate between a the minimal ('black') and maximal ('white') exposure dose levels. A gray shade may, for instance, be realized by switching on only a subset of apertures that may be involved in writing one pixel; for example, 4 out of 16 apertures would give a gray level of 25%. Another approach is reducing the duration of unblanked exposure for the apertures involved. Thus, the exposure duration of one aperture image is controlled by a gray scale code, for example an integer number. The exposed aperture image is the manifestation of one of a given numbers of gray shades that correspond to zero and the maximum exposure duration and dose level. The gray scale usually defines a set of gray values, for instance 0, $1/(n_y-1) \ldots, i/(n_y-1), \ldots, 1$ with $n_y$ being the number of gray values and i an integer ("gray index", $0 \le i \le n_y$). Generally, however, the gray values need not be equidistant and form a non-decreasing sequence between 0 and 1.

FIG. 5 shows the arrangement of apertures in the aperture field of the PD device, according to a basic layout and also illustrates several quantities and abbreviations used in the following. Shown is the arrangement of the aperture images b1 as projected onto the target, shown in dark shades. The main axes X and Y correspond to the direction of advance of the target motion (scanning direction sd) and the perpendicular direction, respectively. Each aperture image has widths bX and bY along the directions X and Y respectively. The apertures are arranged along lines and rows having MX and MY apertures, respectively, with the offset between neighboring apertures in a line and row being NX and NY respectively. As a consequence, to each aperture image belongs a conceptual cell C1 having an area of NX·bX·NY·bY, and the aperture arrangement contains MX·MY cells arranged in a rectangular way. In the following, these cells C1 are referred to as "exposure cells". The complete aperture arrangement, as projected onto the target, has dimensions of BX=MX·NX·bX by BY=MY·NY·bY. In the discussion hereinafter, we will assume a square grid as a special case of a rectangular grid, and set b=bX=bY, M=MX=MY, and N=NX=NY with M being an integer, for all further explanations without any restriction of the generality. Thus, an "exposure cell" has a size of N·b×N·b on the target substrate.

The distance between two neighboring exposure positions is denoted as e in the following. In general, the distance e can be different from the nominal width b of an aperture image. In the simplest case, b=e, which is illustrated in FIG. 6A for the example of an arrangement of 2×2 exposure cells C3, and one aperture image bi0 covers (the nominal position of) one pixel. In another interesting case, illustrated in FIG. 6B (and in line with the teachings of U.S. Pat. No. 8,222,621 and U.S. Pat. No. 7,276,714), e may be a fraction b/o of the width b of the aperture image, with o>1 being preferably (but not necessarily) an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels. The entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area.

FIG. 6B illustrates one example of an oversampling of o=2 combined with placement grids, namely, the image of an aperture array with an exposure cell C4 having parameters o=2, N=2. Thus, on each nominal location (small square fields in FIG. 6B) four aperture images bi1 (dashed lines) are printed, which are offset on a regular grid by pitch e in both X and Y directions. While the size of the aperture image still is of the same value b, the pitch e of the placement grid is now b/o=b/2. The offset to the previous nominal location (offset of the placement grid) is also of size b/2. At the same time, the dose and/or the gray shade of each pixel may be adapted (reduced), by choosing suitable gray value for the aperture image that cover the respective pixel.

As a result, an area of size a is printed but with an enhanced placement accuracy due to the finer placement grid. Direct comparison of FIG. 6B with FIG. 6A shows that locations of aperture images are just arranged on a placement grid twice (generally, o times) as fine as before, while the aperture images themselves overlap. The exposure cell C4 now contains $(No)^2$ locations (i.e., "pixels") to be addressed during the write process and thus, by a factor of $o^2$, more pixels than before. Correspondingly, the area bi1 with the size of an aperture image b×b is associated with $o^2=4$ pixels in the case of oversampling with o=2 in FIG. 6B (also called "double grid"). Of course, o may take any other integer value as well, in particular 4 ("quad grid", not shown) or 8, or also a non-integer value greater one, such as $\sqrt{2}=1.414$.

Figure 7:
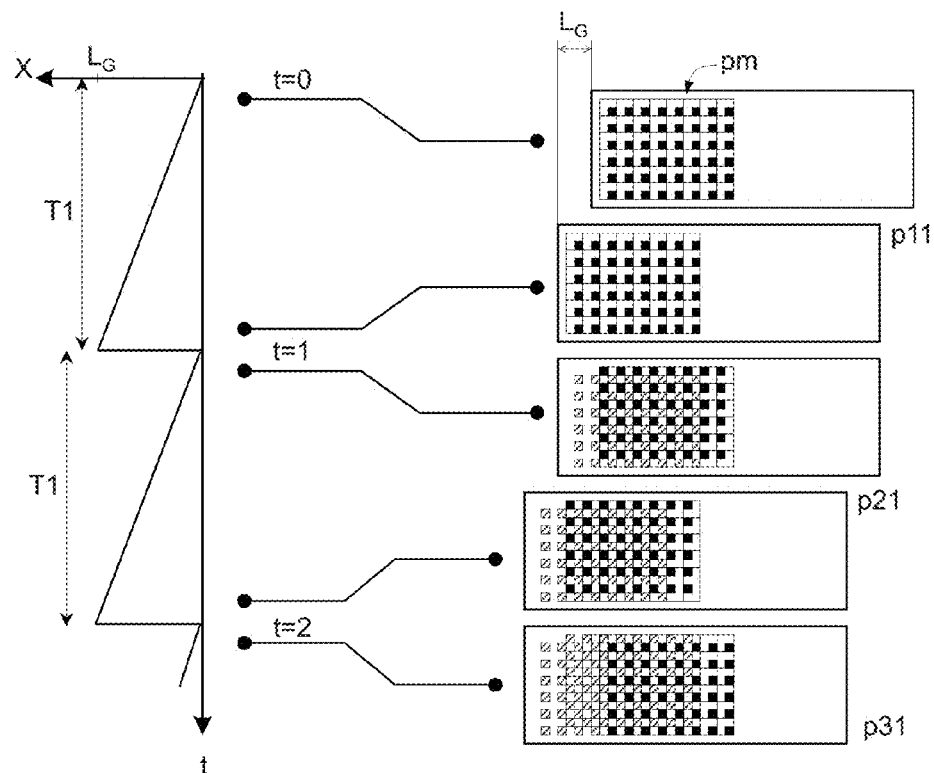
FIG. 7 illustrates the exposure of one stripe.

FIG. 7 shows an exposure scheme of the pixels, which is suitable for many embodiments of the invention. Shown is a sequence of frames, with increasing time from top (earlier) to bottom (later). The parameter values in this figure are o=1, N=2; also, a rectangular beam array is assumed with MX=8 and MY=6. The target moves continuously to the left, whereas the beam deflection is controlled with a seesaw function as shown on the left side of the figure. During each time interval of length T1, the beam image stays fixed on a position on the target (corresponding to a position of a "placement grid"). Thus, the beam image is shown to go through a placement grid sequence p11, p21, p31. One cycle of placement grids is exposed within a time interval L/v=NMb/v, by virtue of the target motion v. The time T1 for exposure at each placement grid corresponds to a length $L_G = vT1 = L/(No)^2 = bM/No^2$, which we call "exposure length".

The beamlets are moved over the distance of $L_G$ during the exposure of one set of image elements together with the target. In other words, all beamlets maintain a fixed position with regard to the surface of the substrate during the time interval T1. After moving the beamlets with the target along distance $L_G$, the beamlets are relocated instantaneously (within a very short time) to start the exposure of the image elements of the next placement grid. After a full cycle through the positions p11 . . . p31 of a placement grid cycle, the sequence starts anew, with an additional longitudinal offset L=bNM parallel to the X direction (scanning direction). At the beginning and at the end of the stripe the exposure method may not produce a contiguous covering, so there may be a margin of length L that is not completely filled.

The size of a single aperture image formed on the target is aX/R, where aX is the opening width of the apertures in the aperture array plate (AAP) and R is the reduction factor of the charged-particle projection optics.

Figure 8A:
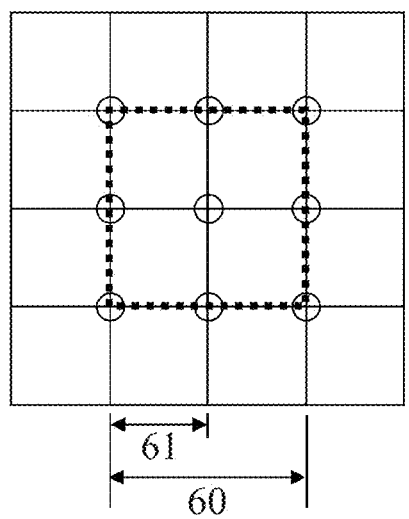
FIGS. 8A-C show three different cases of grid placements, namely
Figure 8B:
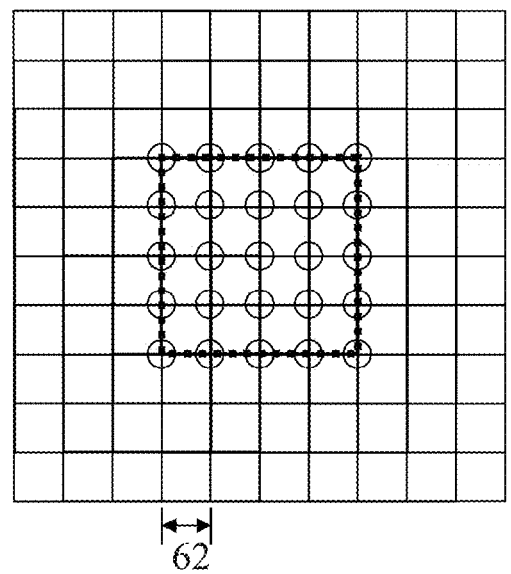
Figure 8C:
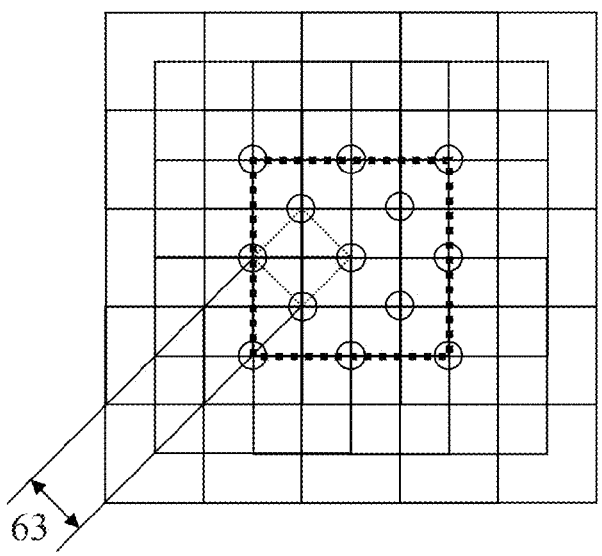

Referring to FIGS. 8A-8C, each exposure spot 60 corresponding to an aperture image bi0, bi1 (FIG. 6A,B) is exposed with discrete dose levels as will be discussed in more detail below. FIGS. 8A-C illustrate various overlap configurations of special interest.

FIG. 8A depicts the "Double Grid" multi-beam exposure as discussed above with FIG. 6B, where the overlap between the exposure spots is half of the beam spot size in X as well as in Y direction as shown in FIG. 8A. In this case the physical grid size 61 is half of the linear size of the spots 60.

In the "Quad Grid" multi-beam exposure illustrated in FIG. 8B, the overlap between the spots is ¼ of the beam spot size in X as well as in Y direction. In this case the physical grid size 62 is a quarter of the spot size width.

FIG. 8c depicts another grid layout, where in addition to Double Grid overlapping beam exposures, beam exposures are done in the centers in between. Therefore, the physical grid size 63 is $\frac{1}{2}^{3/2}$ (i.e., $\sqrt{2}/4$) of the linear spot size. This multi-beam exposure mode is called "Double-Centered Grid".

FIG. 9 illustrates the exposure of one exposure spot with a maximum dose level. In the exemplary case of a 4 bit coding, there are 16 dose levels (0, 1, 2, . . . 15), i.e. the maximum dose level is the sum of 15 dose level increments 64.

Figure 13:
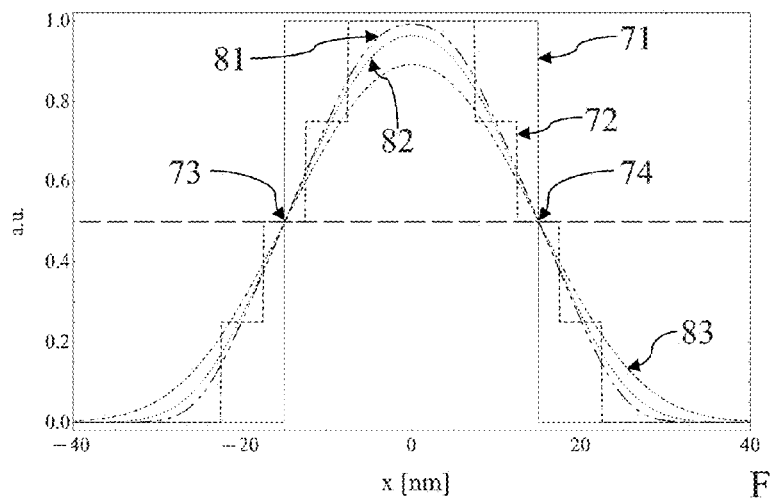
FIG. 13 illustrates the generation of a 30 nm line with the MBW.

FIG. 10 shows the ideal intensity profile 71 for a line of a width 30 nm, in the idealized case of zero blur. When using "Quad Grid" multi-beam exposure the overlap is a quarter of the beam size. Thus, for the case of 20 nm beam size the physical grid size is 5 nm. A discrete dose level can be assigned to each area of the physical grid, which is 5 nm×5 nm for the example chosen; the line 72 in FIG. 10 indicates the superposition of the intensity (or total dose) as it is composed by the overlapping exposure spots with discrete dose levels assigned to the pixel positions for generating the 30 nm line, whereas for better visibility the blur has been set to zero (so that the dose distribution of a single exposure spot becomes a rectangle). If the blur has a realistic value such as shown in FIG. 13, the step function at the edge of the rectangle is convoluted with a Gaussian function, which eventually transforms to a Gaussian shape. In that sense the line 72 can be seen as superposition of Gaussian functions at blur zero. In the general case the dose level histogram will not be symmetrical in order to position the left and right edge at pre-defined positions.

FIG. 11 shows a simulation for a line of 30.0 nm width, with the left edge to be positioned at 0.0 nm and the right edge at 30.0 nm. For the simulation, it was assumed that beam spots of 20 nm are exposed with 5.1 nm 1sigma blur (i.e., 12.0 nm FWHM blur). The intensity profile 76 is formed by overlapping the profiles of the exposure spots 73, 74, and 75. The dose level of the leftmost exposure spot 74 is adjusted such that the 30 nm line starts at the desired start position 77, i.e. at 0 nm. The dose level of the rightmost exposure spot 75 is adjusted such that exposed line ends at position 78 at 30.0 nm. As can be seen in FIG. 11, in accordance with "Quad Grid" exposure, the overlap of the exposure spots 73, 74, 75 is a quarter of the beam size, i.e. 5 nm.

FIGS. 12A and 12B illustrate how certain embodiments of the invention enable the MBW device to write lines with precise edge definitions; in each figure, the top frame shows the edge position error vs. line width, the middle frame the intensity profile, and the bottom frame shows the edge position deviation when enhancing the exposure dose by 10% vs. line width. FIG. 12A shows the intensity profile obtained for a 31.4 nm line width, and FIG. 12B for a 40.0 nm line width. Using the MBW with 20 nm beam size and Quad Grid exposure (5 nm physical grid size), the line width of the structure generated by the exposure can be changed in steps of 0.1 nm. Because of the integer dose levels there are slight deviations from the 0.1 nm address grid. These deviations are indicated as "edge position error" (top frames), as functions of the desired line width, in 0.1 nm steps between 30.0 nm and 40.0 nm. As can be seen the deviations are within ±0.05 nm. Furthermore, the change of edge position with 10% change of dose is only approx. 1 nm, varying only slightly with change of line width as shown in the bottom frames. In other words, since the dose is controlled in a MBW to better than 1%, the change of edge position with 1% change of dose is within approx. one atomic layer.

Figure 13A:
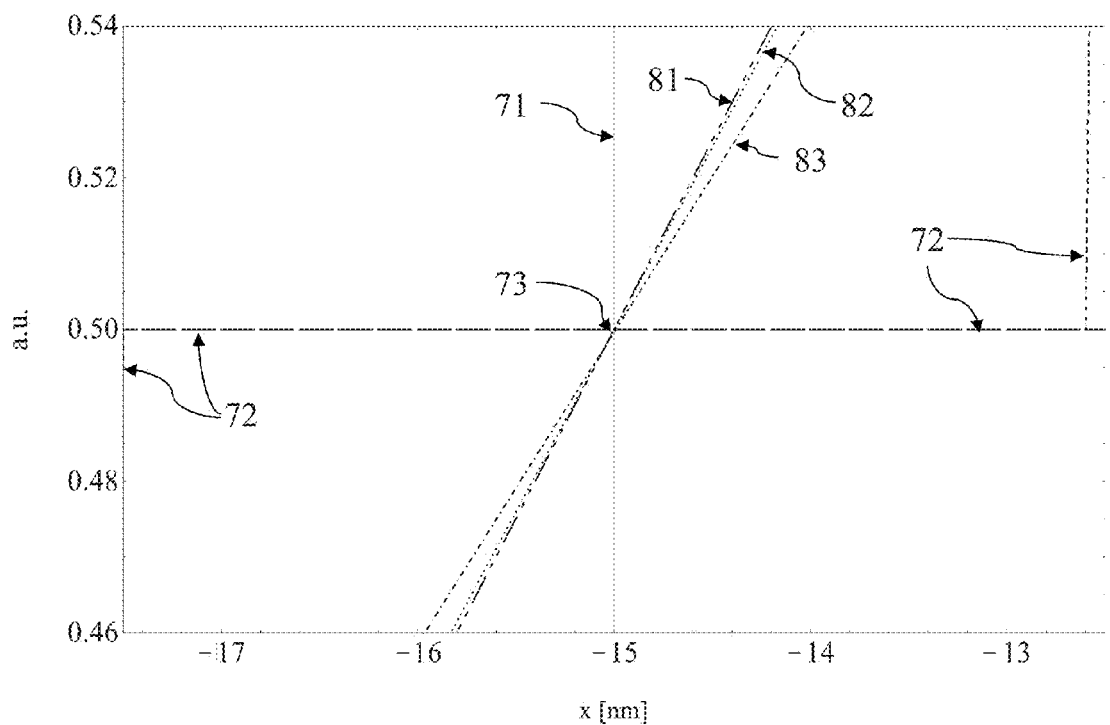
FIG. 13A shows a detail of FIG. 13 at the left-hand flank where the intensity profiles crosses the "0.5" intensity level.

FIG. 13 illustrates a most important advantage of the MBW, namely, that the line width is virtually independent of blur at the 50% dose threshold. Shown in FIG. 13 are the intensity profile 71 for zero blur, the dose level histogram 72, and resulting intensity profiles 81, 82, 83 calculated with 3.5 nm, 5.0 nm, and 7.5 nm 1sigma blur, respectively. The edge positions 73 and 74 of the generated structure are where the zero blur intensity profile 71 crosses the "0.5" intensity level. The enlarged detail of FIG. 13A shows the region around the position 73 at the left-side flank. The dose level assignments 72 are for using 20 nm beam size with 1sigma blur of 5 nm and Quad Grid multi-beam exposure, providing a 5 nm physical grid size.

FIGS. 14A, 14B, and 14C show intensity profile diagrams illustrating how the multi-beam exposure methods illustrated here can achieve a fine positioning of structure feature with resolution smaller than the grid size. In the intensity profile diagrams, like those of FIGS. 14A-C, the discrete dose levels are visualized as rectangles 64 of uniform height, piled up in a "brick-layer" arrangement; of course, this "brick-layer" depiction is only symbolical and intended to facilitate interpretation of the drawings.

FIG. 14A shows a dose level histogram, for the example of a line of 30 nm width exposed by means of a 4 bit (i.e., 15 dose levels per spot) exposure in a Quad Grid with a beam spot size of 20 nm width. The grid size 62 is ¼ of the linear size of the exposure spots, which are symbolized as rectangles piled up in a "brick-layer" arrangement, and the resulting dose level distribution 65 is outlined as a bold line.

The line width can be made smaller or larger in very fine steps, which are smaller than the grid size, in this case the Quad Grid size 62. Reducing the line width can be achieved by lowering the dose level of the outermost exposure spots and/or omitting exposure spots (the latter when the reduction is at least about one half of a exposure spot size). Increasing the line width can be achieved by enhancing the dose level of the outermost exposure spots and/or, in particular when the maximum dose level has been reached, to add an additional, preferably overlapping, exposure spot. The latter aspect is illustrated in FIG. 14A: an exposure spot 66 having a defined dose level is added, resulting in a dose level histogram 67 for the line with larger width compared to 65. By combining these effects of decreasing and increasing on either side, there is also the possibility to shift the line position in very fine steps. FIG. 14B illustrates a shift of the line without changing the width, which is achieved by removing dose levels from spot 68 and adding dose levels from spot 69, resulting in the dose level histogram 70 which corresponds to a line shifted to the right as compared to the line of FIG. 14A.

The intensity profiles of FIGS. 14A-C are shown along the X direction of the target plane. It is straightforward to extend the multi-beam exposure methods illustrated here to lines along other directions as well, and fine positioning can be achieved for lines at any angle to the on the target plane.

Under realistic circumstances there are deviations of the local exposure dose with respect to the targeted exposure dose within the BAF. Furthermore a slight variation of beam blur over the exposure field is to be expected. This is illustrated in FIGS. 15A and 15B.

Figure 15A:
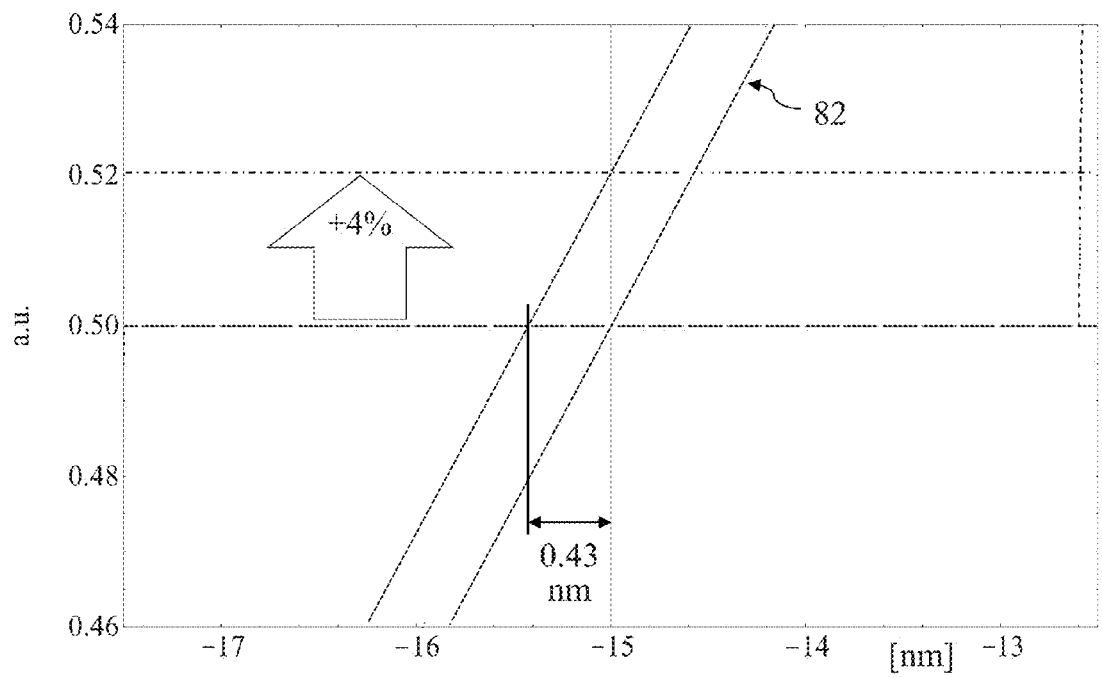
FIGS. 15A,B show detail views like that of FIG. 13A, where

FIG. 15A shows an exemplary case where, starting from the case of 5 nm 1sigma beam blur with intensity profile 82 of FIG. 13, the exposure dose deviates from the nominal dose level by +4%. As can be seen, the line edge at 0.5 intensity level is shifted by 0.43 nm. This means that in this example, instead of a CD of 30.0 nm, a line with having a width of 30.0 nm+2*0.43 nm=30.86 nm will be printed as a result of the dose level increment of 4%.

Figure 15B:
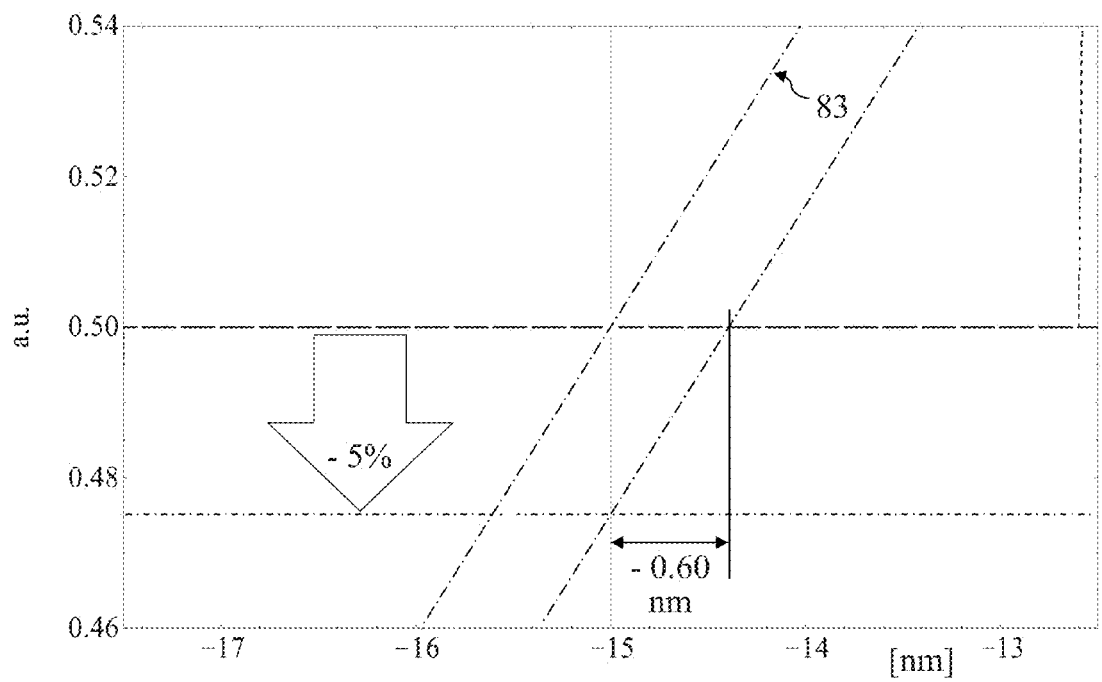
FIG. 15B illustrates the effect of decreasing the intensity distribution by 5%, causing a line edge shift of 0.48 nm.

As illustrated in FIG. 15B, starting from the local beam intensity profile 83 of FIG. 13 with 1sigma blur of 7.5 nm, a dose error causing a dose level decrement of −5% will shift the edge position by −0.60 nm, so instead of a CD of 30.0 nm, a line with 28.8 nm width would be printed.

If indeed within a BAF there were such high deviations of dose (i.e., +4%/−5%), a LCDU variation as large as 2.06 nm would result. The GCDU variation would be even higher, as there are additional errors (due to beam tracking, laser-interferometer, etc.).

Fine Adjustment of LCDU and GCDU

According to many embodiments of the invention a correction of CD is proposed which can be done by a convolution of the graphical representation of the desired pattern, such as rasterized bitmap data, with a matching convolution kernel (MCK), short "kernel".

Figure 16A:
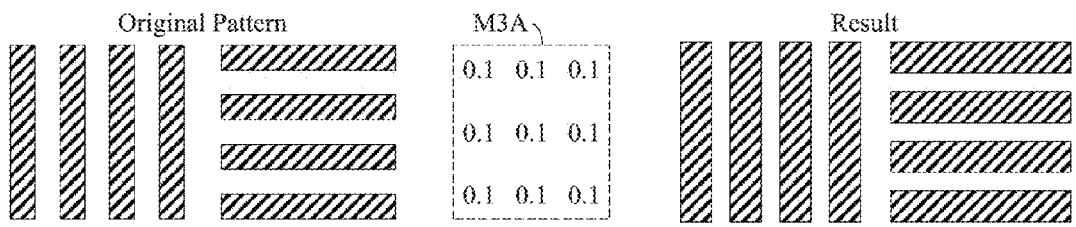
FIG. 16A-H show examples of how simple kernels can be used according to several embodiments of the invention for correcting a CD.
Figure 16B:
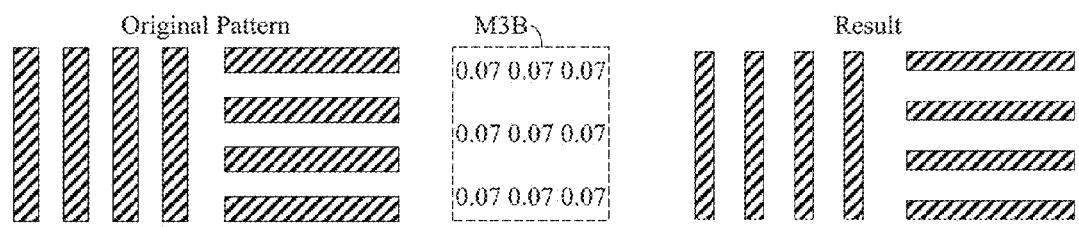

Simple examples of kernels according to a number of embodiments of the invention are shown in FIGS. 16A-H. In each of these eight figures, the left-hand portion represents an original pattern, in the middle a 3×3 kernel is shown, and the right-hand portion shows the resulting pattern when the respective kernel is applied. With kernel M3A a widening of vertical and horizontal lines is accomplished, as illustrated in FIG. 16A. FIG. 16B illustrates the opposite case where kernel M3B effectuates a reduction of the width of the vertical and horizontal lines. This is achieved by unnormalized kernels M3A, M3B, i.e. kernels where the normalization $K^\circ = \Sigma K_{kl}$ (i.e., the sum over all elements) is different from 1. In particular, in the case of kernel M3A, the normalization is greater than one, $K^\circ > 1$; whereas for kernel M3B the normalization is smaller than one, $K^\circ < 1$.

Figure 16C:
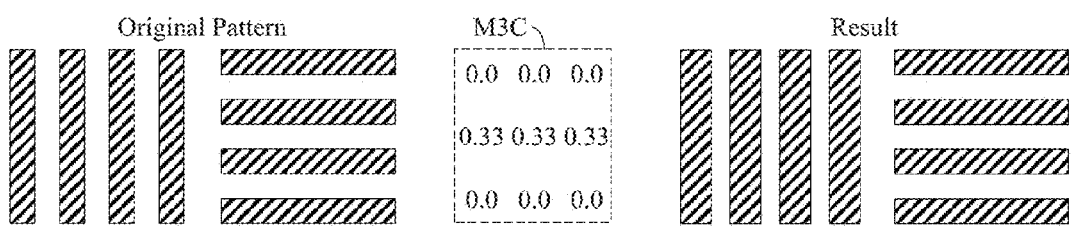
Figure 16D:
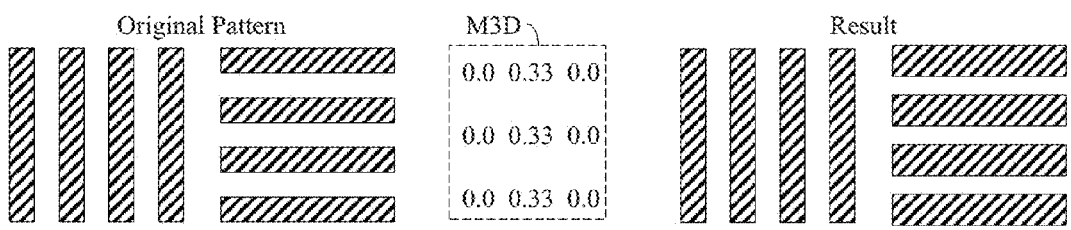
Figure 16E:
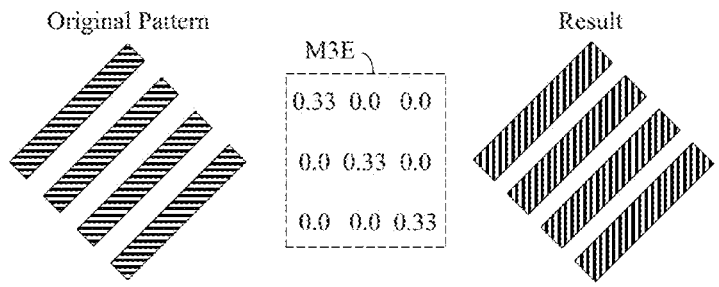

There is also the possibility to only widen vertical or horizontal lines selectively, as illustrated in FIGS. 16c and 16D for kernels M3C and M3D, respectively. This is also possible for lines under 45°, see FIG. 16E with kernel M3E. It is straightforward that any lines at arbitrary angles can be adjusted with kernels of suitable chosen size and values.

Figure 16F:
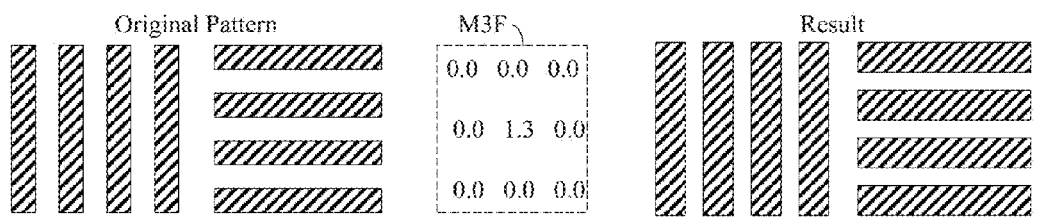
Figure 16G:
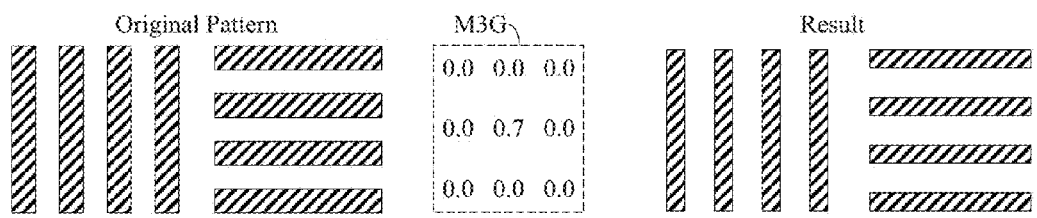
Figure 16H:
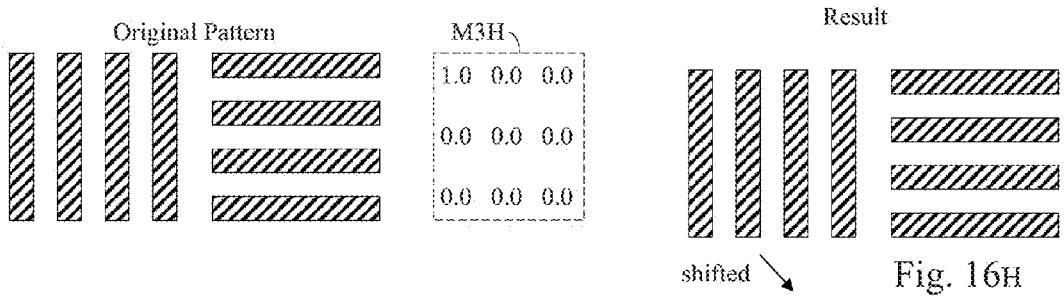

Further examples relating to several embodiments of the invention are illustrated in FIGS. 16F-H. FIG. 16F shows a variant which leads to a broadening of lines in all direction using a simple kernel M3F with only one central entry larger than one (unnormalized kernel). This corresponds to an increment of the overall dose via a convolution. The opposite case is illustrated in FIG. 16G using a simple kernel M3G which only has one central entry, but smaller than one. Yet another variant is illustrated in FIG. 16H where a single non-zero entry (normalized) located off the center of the kernel M3H leads to a shift of the whole pattern. Of course, the various examples given here may be combined or modified as deemed suitable for a specific application.

Figure 17:
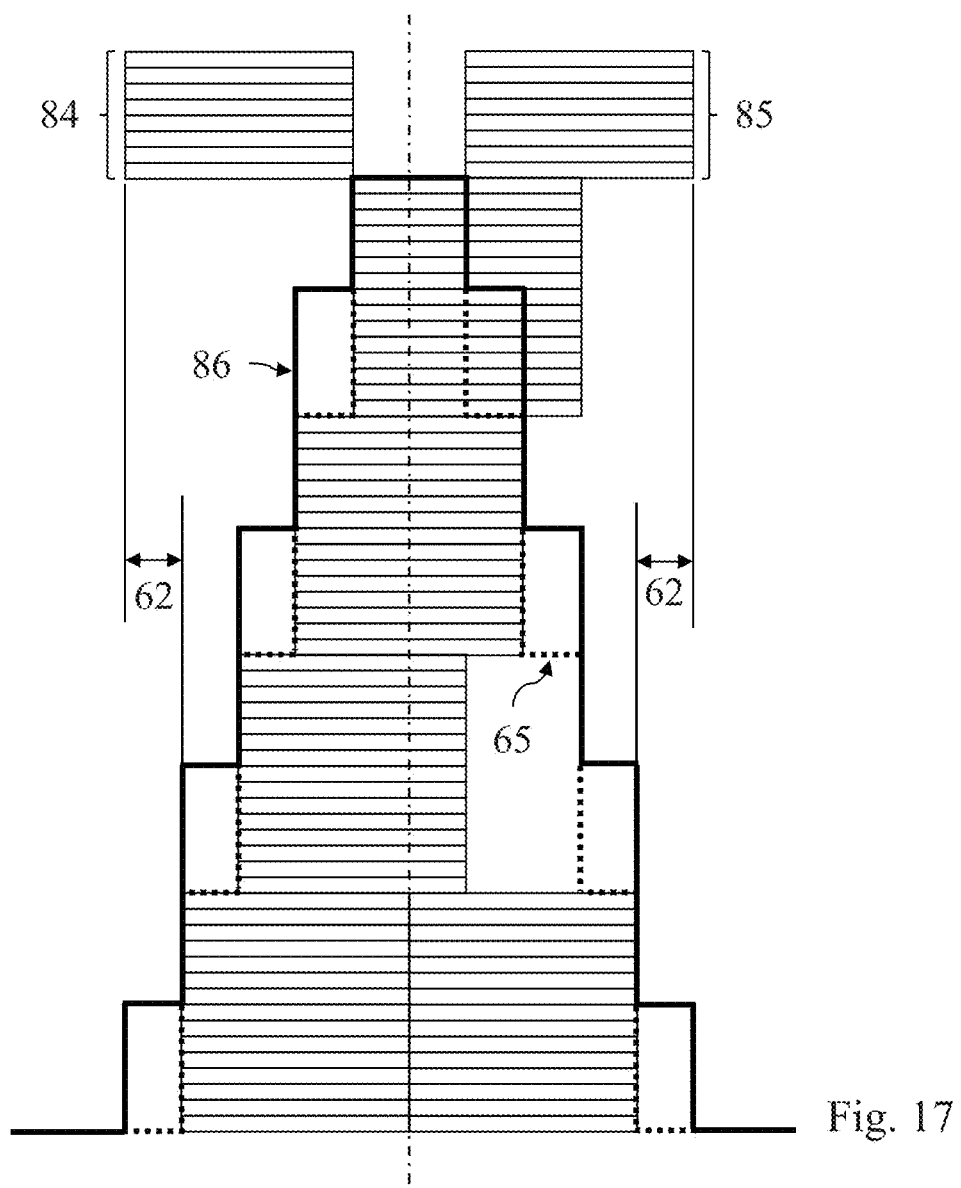
FIG. 17 illustrates the widening of a single line feature by applying a kernel according to several embodiments of the invention.

As an example FIG. 17 shows the widening of the 30 nm line with the dose level histogram 65 (FIG. 14A) by adding overlapping exposure spots 84 and 85 to result in the dose level histogram 86.

Figure 18:
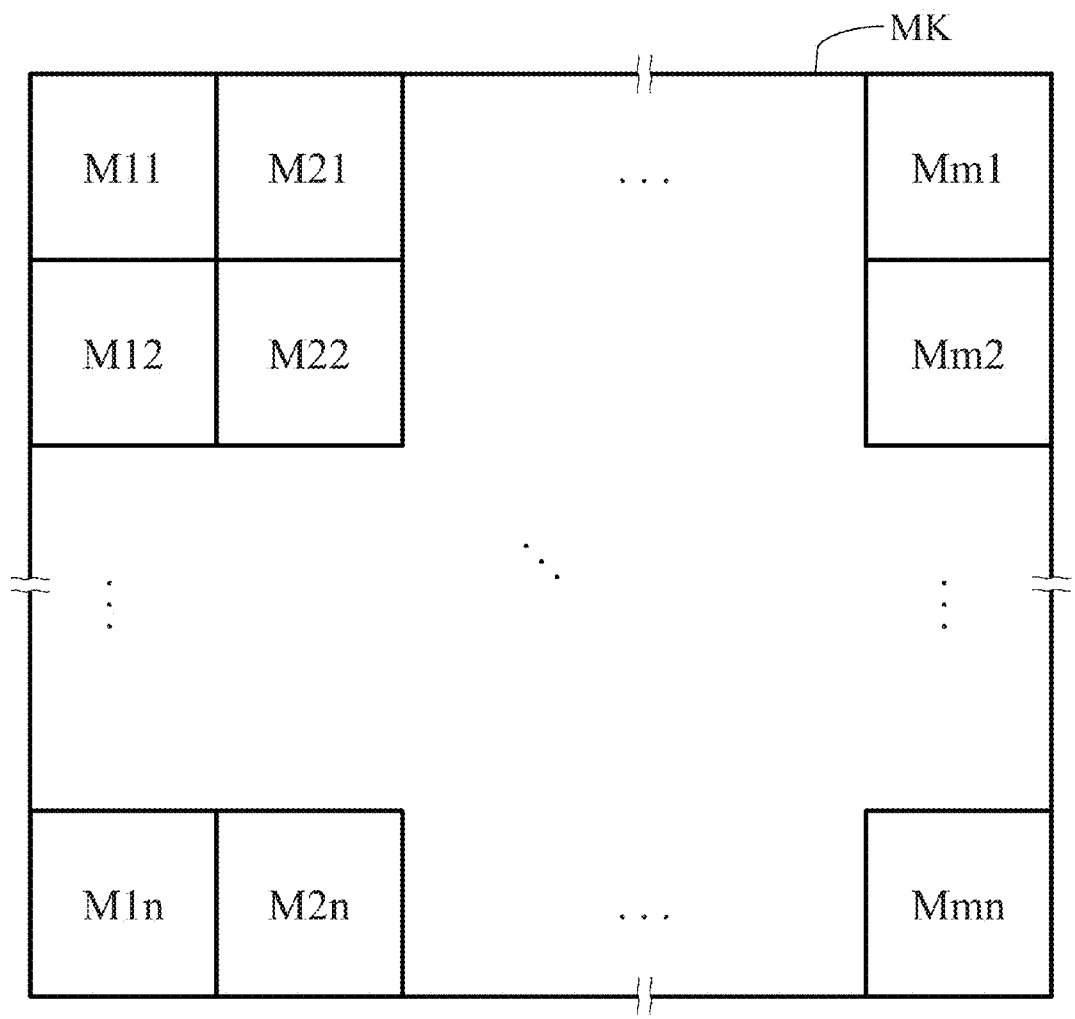
FIG. 18 illustrates the application of multiple kernels in one beam array field.

A further aspect of a number of embodiments of the invention envisages the application of different kernels in different areas of a beam array field (BAF). This enables compensation of variations of the CD over the BAF. For instance, referring to FIG. 18, in order to homogenize the ΔCD values within a BAF such as the BAF as mentioned above having 512×512 programmable beams, the BAF, denoted MK in FIG. 18, is subdivided into m×n sub-fields of rectangular or square shape, where in each sub-field a respective matching convolution kernel M11, M21, . . . Mm1, M12, M22, . . . , Mm2, . . . M1n, . . . Mmn is defined.

The numbers m and n are integer number >1 chosen suitably, but at least one order below the number of programmable beams within one line along the X or Y direction, respectively, within the BAF.

A suitable way to determine the various kernels M11 . . . Mmn is by printing a particular test pattern (typically lines and spaces in different directions, e.g. in horizontal, vertical, 45° and 135° orientation, having specific nominal CDs) within a beam array field, i.e. local, and carefully measuring the ΔCD values in the respective directions (X, Y, 45° and) 135° in the m×n subfields, e.g. using a suitable scanning electron microscope (so called CD-SEM). Thus, for each subfield BAF_11 . . . BAFmn a pair of ΔCD values (i.e., values ΔCDX, ΔCDY for X and Y directions, respectively) is obtained (FIG. 18A), and a corresponding subfield-kernel (FIG. 18B) is generated for compensating the ΔCD values. With this a further MBW exposure is done which is evaluated to result in improved ΔCDX* and ΔCDY* values (FIG. 18c).

In case the targeted LCDU performance is not yet achieved, it is possible to further fine-tune the subfield-kernels MCK-BAF_11 . . . MCK-BAF_mn (FIG. 18B) until a further optional MBW exposure and corresponding metrology confirms that the desired specifications are reached. For instance, in order to further improve the compensation of the ΔCD values, an improved set of kernels, to replace the kernels MCK-BAF_11 . . . MCK_BAFMn, may be determined; this may be iterated as often as suitable.

As one alternative to using exposures and CD-SEM evaluations there is also the possibility of precise in-situ metrology in the MBW tool of the applicant. With this an optimization of the LCDU can be achieved in considerable shorter time.

Figure 19:
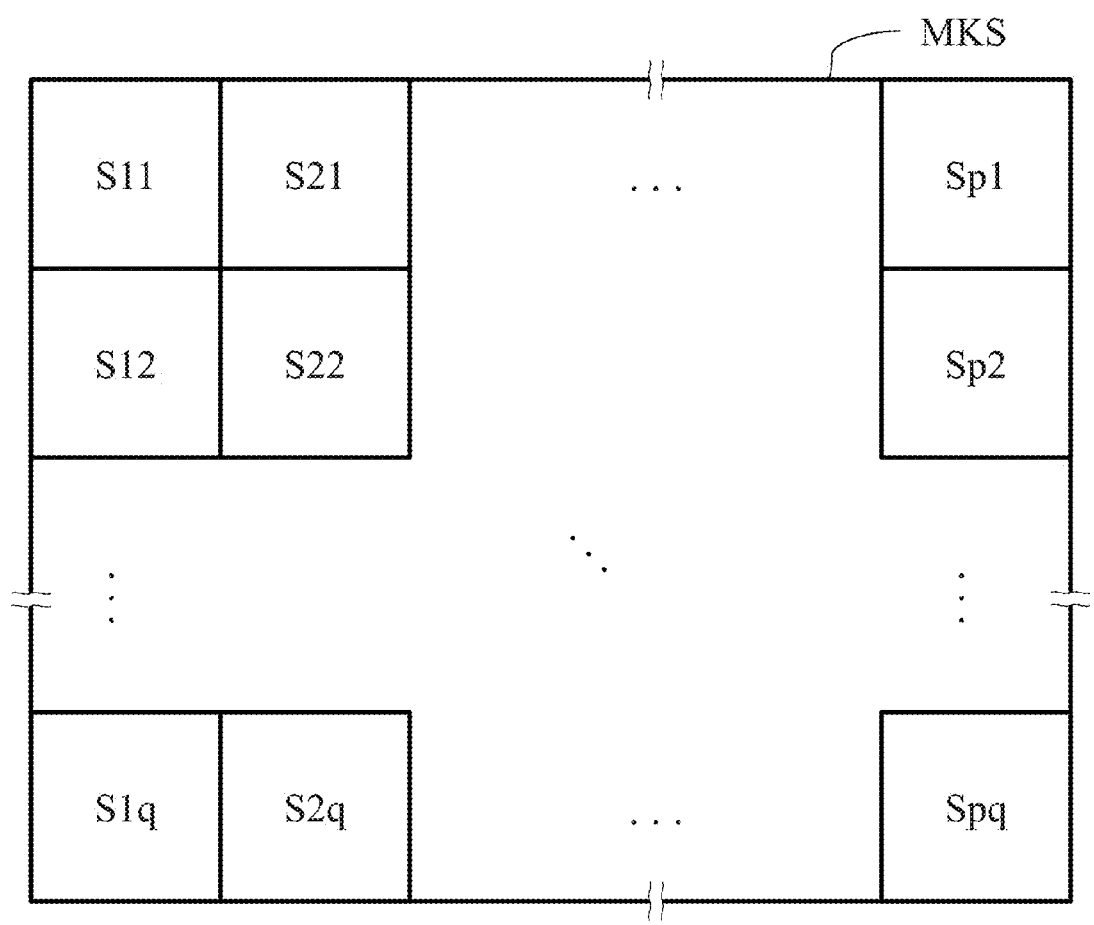
FIG. 19 illustrates the application of multiple kernels on the substrate exposure field.

FIG. 19 illustrates another approach using multiple kernels, namely, with regard to the substrate exposure field (SEF, denoted MKS in FIG. 18), i.e., the image area on the target which is to be exposed, that is, the global field. For printing a substrate exposure field with the MBW tool, this approach envisages to divide the SEF into a discrete number of subfields, e.g. p×q subfields S11, S21, . . . Sp1, S12 . . . Spq and to assign a MCK to each of these subfield.

Figure 18A:
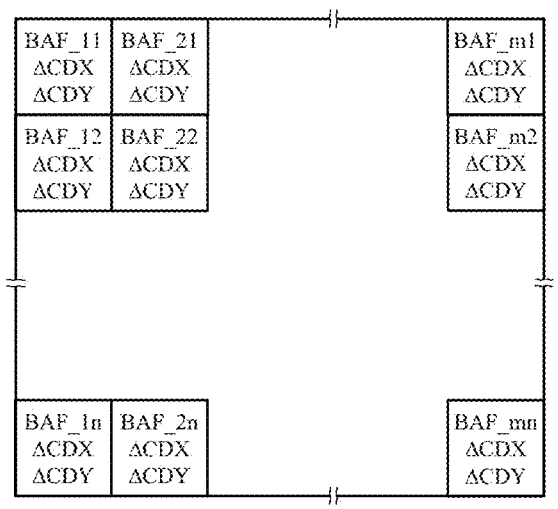
FIGS. 18A-C show the determination of the multiple kernels of FIG. 18.
Figure 18B:
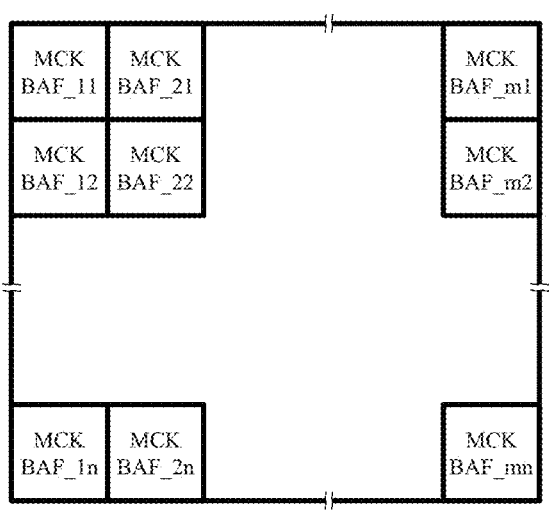
Figure 18C:
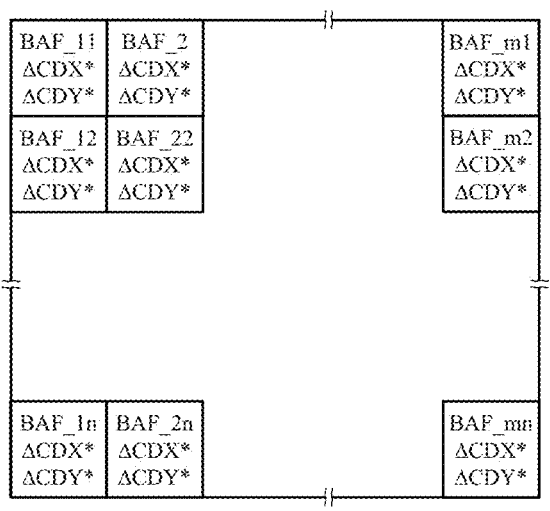
Figure 20A:
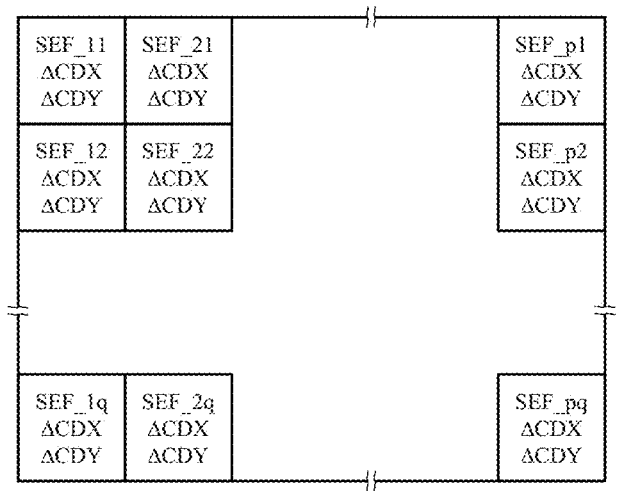
FIGS. 20A-C show the determination of the multiple kernels of FIG. 19.
Figure 20B:
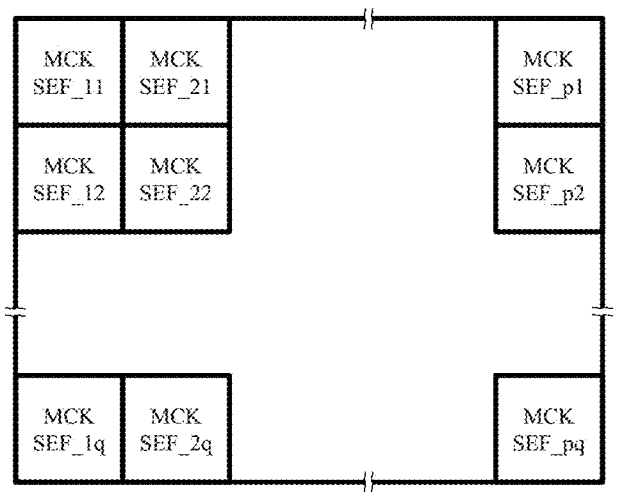
Figure 20C:
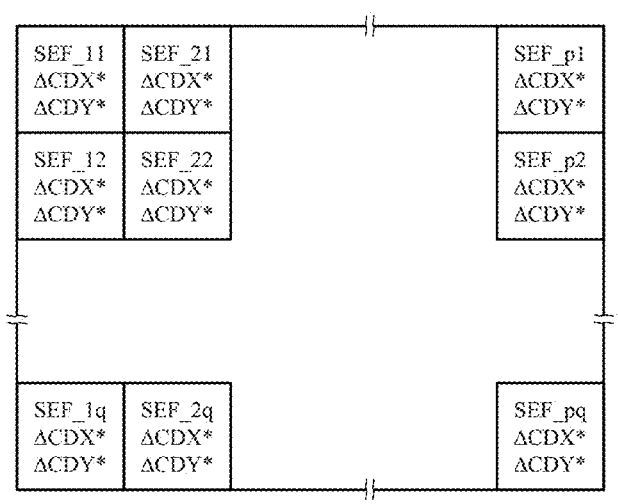

Referring to FIGS. 20A to 20c, which are depictions analogous to FIGS. 18A-C, after MBW exposure and having measured the ΔCDX, ΔCDY, ΔCD_45° and/or ΔCD_135° in each of these subfields SEF_11 . . . SEF_pq, e.g. using a CD-SEM (FIG. 20A), the kernels MCK-SEF_11 . . . MCK_SEFpq for each of the subfields (FIG. 20B) are applied to expose a second substrate exposure field, so that the improved values ΔCD* and ΔCD* can be obtained (FIG. 20c). Optionally, in order to further improve the compensation of the ΔCD values, an improved set of kernels, to replace the kernels MCK-SEF_11 . . . MCK_SEFpq, may be constructed for a further optional exposure of the test patterns distributed on the SEF, with respect to subfields, which should then yield a further adapted/improved GCDU. This can be iterated as often as suitable.

The method as described in above section is appropriate in the usual condition of using a MBW tool of the applicant with resist materials which do not lead to a large "resist blur", i.e. the low blur of the electron-optical column is not influenced significantly.

Homogenization of the Beam Blur within the Beam Array Field

Even better optimization of LCDU and GCDU will be achieved by first carrying out a homogenization of the beam blur within the beam array field. Many embodiments of the invention offer procedures for achieving such a homogenization of the beam blur as outlined below.

Figure 21:
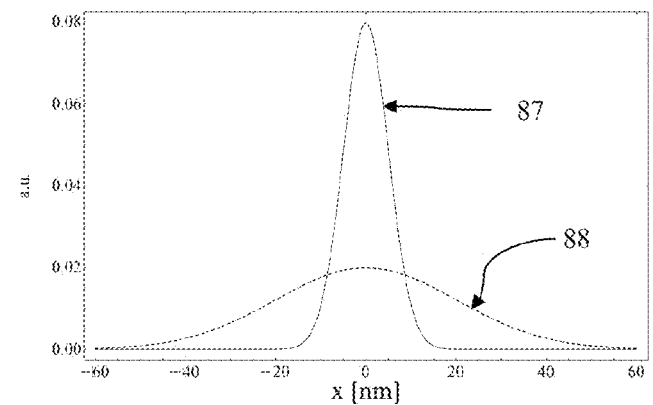
FIG. 21 shows typical point spread functions (PSF) with 5.0 nm 1sigma and 20 nm 1 sigma.

In order to better visualize the method according to certain embodiments of the invention, the method is exemplified to a case of strongly degraded intensity blur. Such a situation might be the case when using a chemically amplified resist (CAR) materials with very low (5-10 μC/cm$^2$) exposure dose. Such low dose CAR materials exhibit strong side diffusion and therefore cause a significant degradation of intensity blur. FIG. 21 shows an example where the point spread function (PSF) 87 with 5 nm 1sigma blur of a MBW electron-optical column is degraded to a PSF 88 with 20 nm 1sigma blur.

Figure 22:
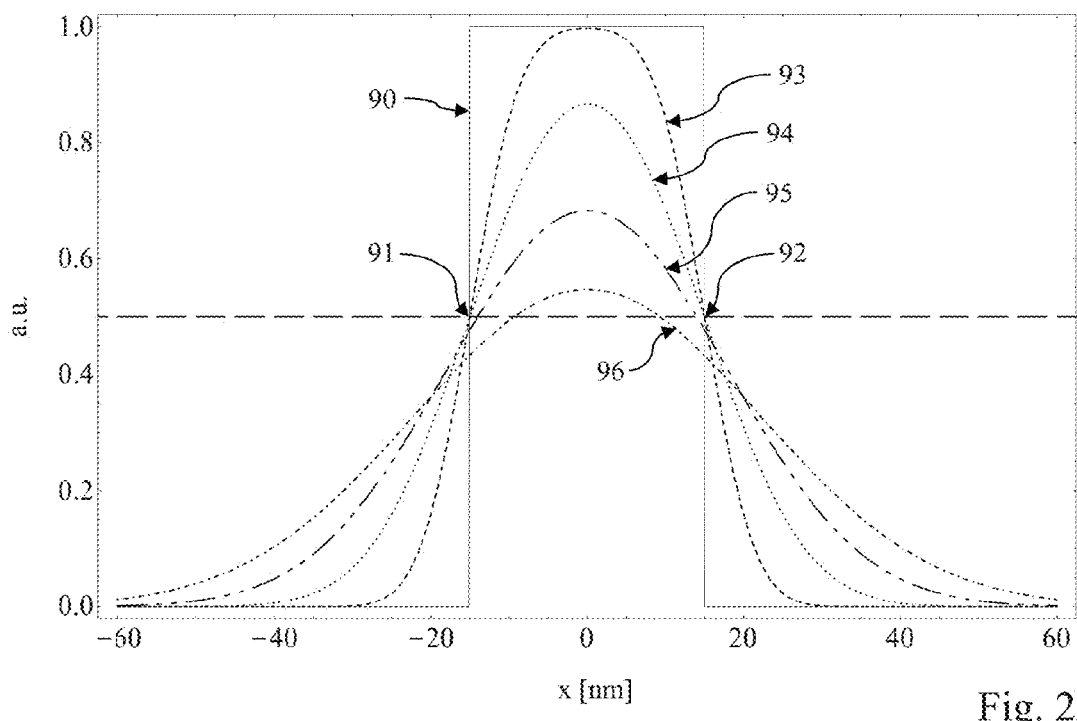
FIG. 22 illustrates intensity profiles the MBW employing the PSF and kernel of FIG. 21.
Figure 22A:
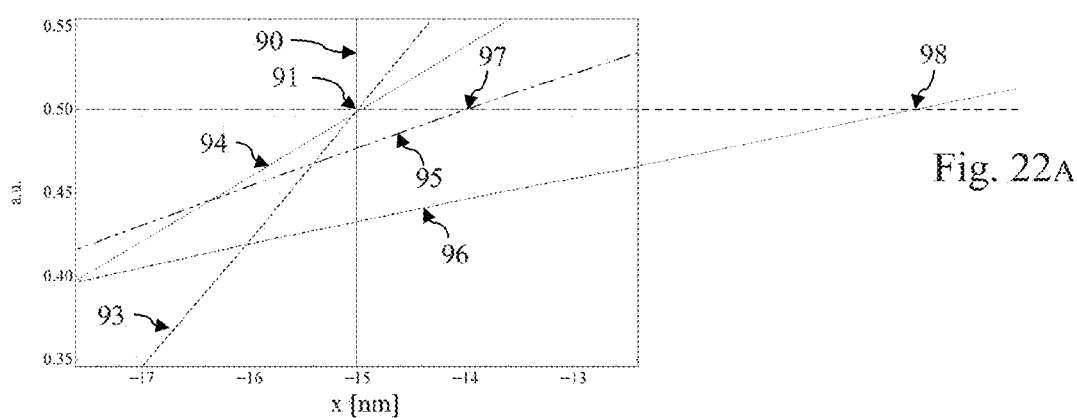
FIG. 22A shows a detail of FIG. 22 at the left-hand flank where the intensity profiles crosses the "0.5" intensity level.

From FIG. 22 it is evident that the intensity distribution is degraded with increased PSF. Neglecting blur ("zero blur"), the intensity profile 90 is shown for a line with 30 nm line width. The "0.5" level of the intensity profile corresponds to the "dose to clear" separating regions with and without resist development from each other. Since the "0.5" level defines the edge of the line to be written, the effect of the blur may cause different dose latitudes and thus deviations of the edge position as written from the nominal desired positions. The desired positions 91 and 92 of the left-hand edge and right-hand edge, respectively, are met for the zero-blur intensity profile 90. For a 5 nm 1sigma blur the intensity profile 93 can still fulfill this condition to a large extent; but the intensity profiles 94, 95, and 92, which correspond to 10 nm, 15 nm, and 20 nm 1sigma blur, respectively, are increasingly deviating. In particular, as can be seen from the enlarged detail of FIG. 22A, the positions of the intensity-profile (i.e., "0.5"—level intersections) are shifted off desired edge positions 91 and 92 (left-hand and right-hand edge, respectively) to degraded edge positions 97 and 98, respectively, with the intensity profiles for a 1sigma blur of 15 nm and 20 nm.

A homogenization of the beam blur with the MBW BAF is accomplished according to a number of embodiments of the invention by a convolution of the graphical representation of the desired pattern, such as rasterized bitmap data, with a MCK kernel. This kernel according to the certain embodiments of the invention enables to eventually generate virtually the same intensity distribution over the BAF.

Figure 23:
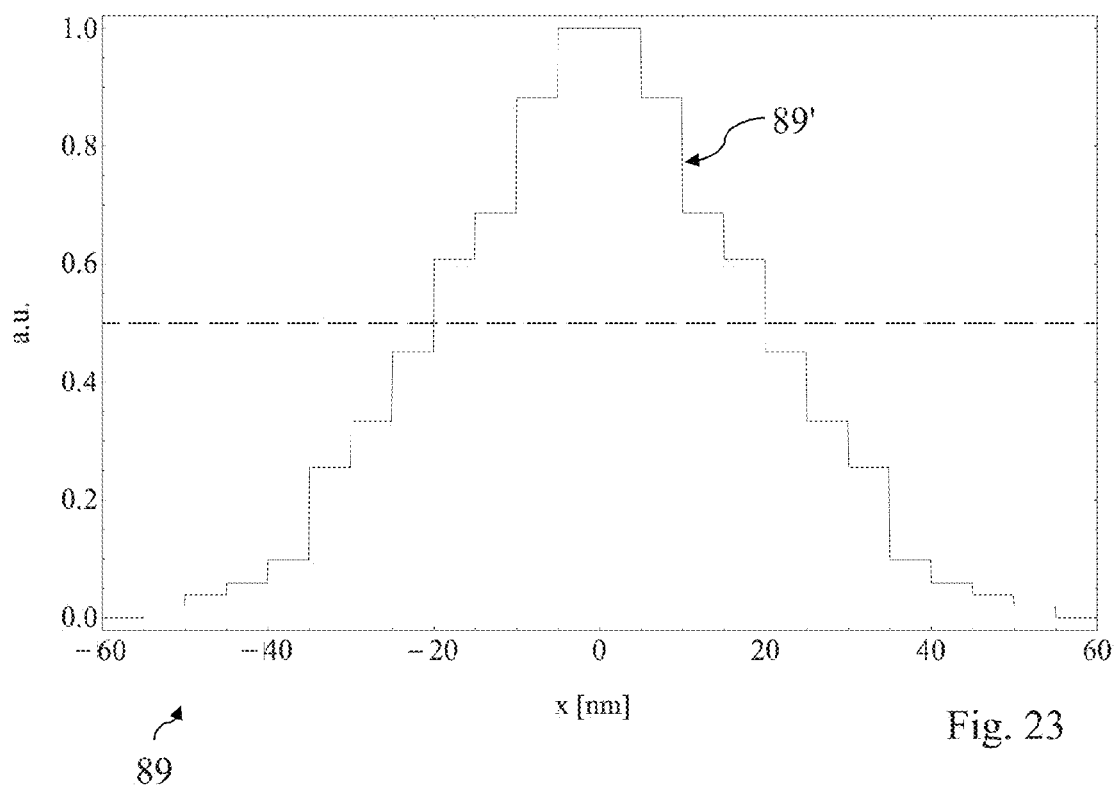
FIG. 23 shows an example of a kernel for emulating the exposure with a large blur.

FIG. 23 shows an example of a kernel 89 according to a number of embodiments of the invention, in this case for having a MBW with 20 nm beam size and Quad grid exposure (5 nm physical grid size) emulate a "deteriorated" region within the beam array field having a 1sigma blur of 20 nm. The kernel is shown in a histogram representation 89', equivalent to a representation as a one-dimensional array of rounded real values. The methods how to determine the kernel are explained below. The kernel may also have a simple shape, such as a rectangle shape (i.e., taking a constant value within finite interval, but zero elsewhere; that is, a rectangular function, see FIG. 24A) or triangle shape (i.e., a linear rise from zero to a peak value and then falling linearly to zero again, zero elsewhere, see FIG. 24B), or other shape according to a suitable function, e.g. a sin c function (so-called cardinal sine, sin c(x)=sin(x)/x, cf. FIG. 24c) or a Gaussian (cf. FIG. 24D). The kernel functions of FIGS. 24A-D are characterized by a spatial range parameter (width of rectangle or triangle, distance of first zero from the maximum, or FWHM parameter of the Gaussian) which is typically chosen corresponding to the blur value of the reference tool. For example in FIG. 24A the full range of the blur would be in the order of twice the full-width-half-maximum value of the blur when this kernel is used to match the blurring behavior of the reference tool. In case of the differential kernel of FIG. 24c the spatial distance between the first-order zeros is a measure of the dose slope that is generated by filtering, or in special cases causes a selectivity for features that correlate with this length. In particular, the kernel in FIG. 24c allows to pronounce features with size 30 nm, which is the approximate distance of the first-order zeros.

Figure 26:
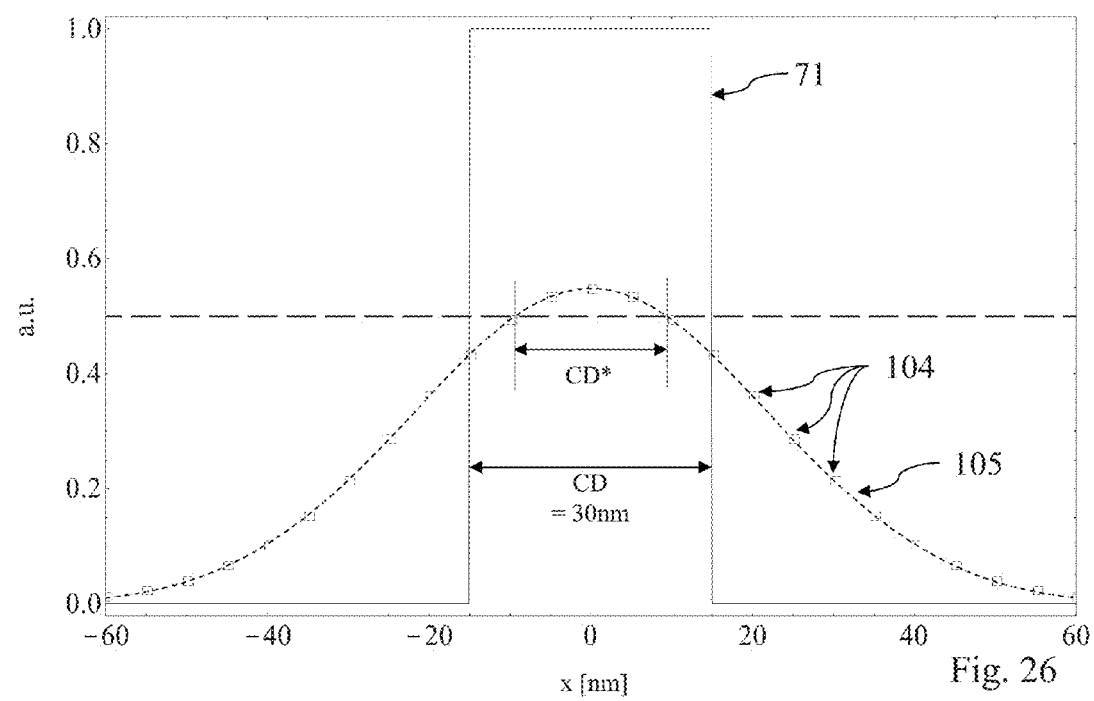
FIG. 26 shows the intensity profile resulting from the histograms of FIG. 25, where the dashed line indicates the profile produced by the MBW when using the kernel of FIG. 23.
Figure 27:
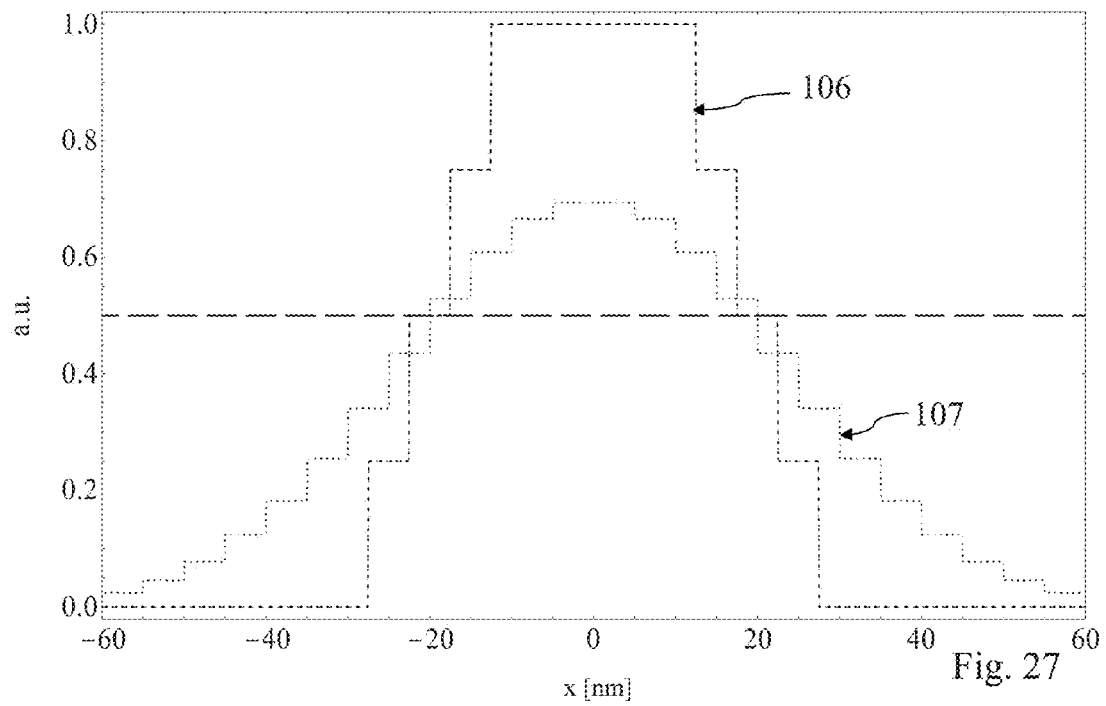
FIGS. 27 and 28 show dose level histograms and the resulting intensity profiles for a line with a target width of 40 nm, in depictions analogous to FIGS. 25 and 26, respectively.

FIG. 27 shows the dose level convolution 106 which is obtained by convoluting the kernel 89 (FIG. 23) with the MBW dose level assignment 65 (FIG. 14A) for a line width of 30 nm. Assuming a 1sigma blur of 5.0 nm of the 20 nm exposure spots with the dose level assignment 103, an intensity profile as indicated by symbols 104 is obtained as shown in FIG. 26. The dotted line 105 represents the intensity profile 96 with 20 nm 1sigma blur (FIG. 21). It is important to note that the two intensity profiles 104 and 105 coincide with only minimal deviation, barely visible in FIG. 26. FIG. 26 also illustrates the zero blur intensity profile 71 of the 30 nm line. The intensity profiles 104 and 105 are above the "0.5" dose level (which determines the development of the exposed charged-particle sensitive resist) for a line width CD* considerably smaller than CD=30.0 nm. Thus, the MBW tool exposure was "degraded" with the convolution kernel in a manner which exactly matches the behavior when having a PSF intensity blur 88 with 20 nm 1sigma blur.

Figure 25:
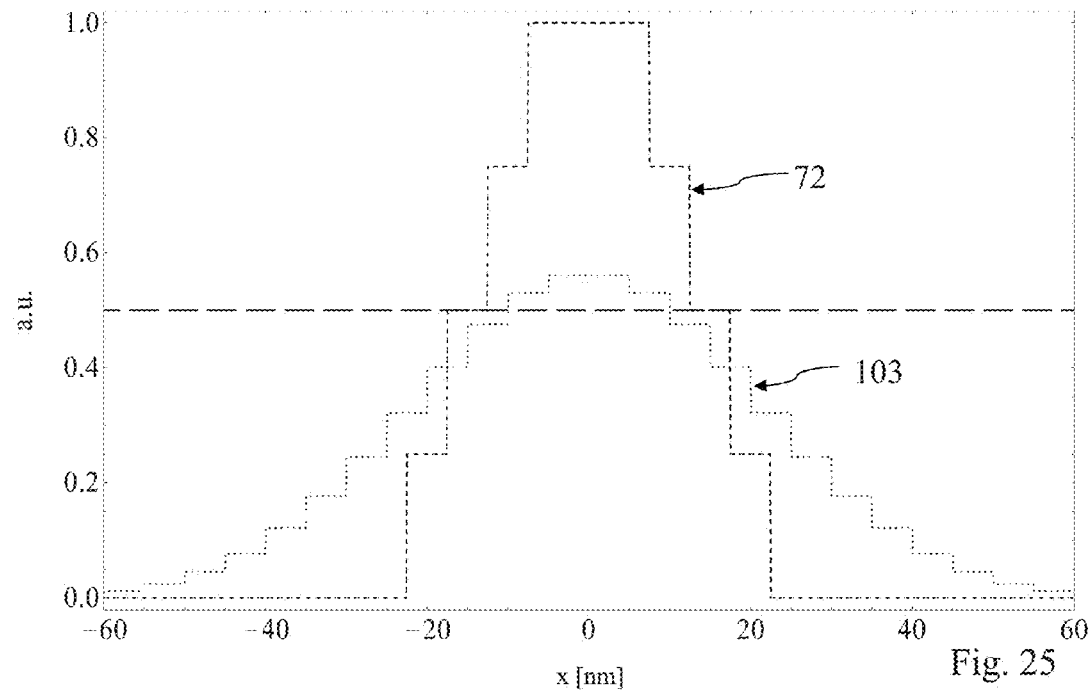
FIG. 25 depicts a dose level histogram of the MBW for a line with a target width of 30 nm, and the dose level histogram resulting from the convolution with the kernel of FIG. 23.
Figure 28:
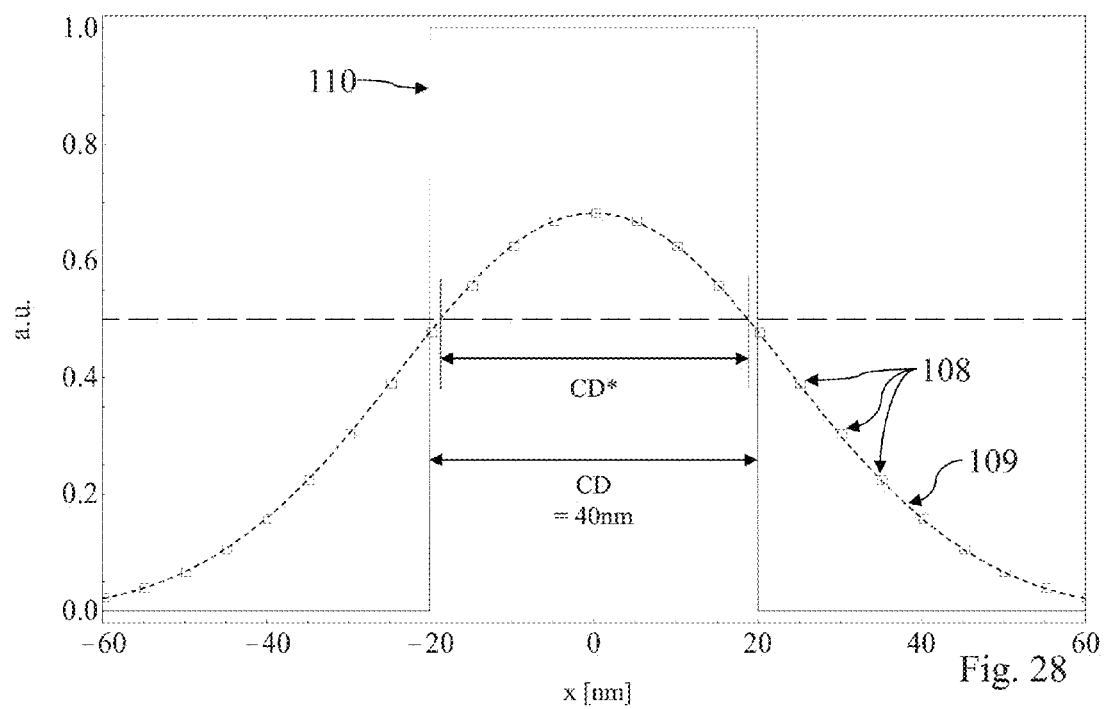

FIGS. 27 and 28 illustrate an example for CD=40.0 nm according to a dose level assignment 106, as shown in diagrams analogous to FIGS. 25 and 26. The same kernel 89 was used to generate a dose level convolution 107, leading to an intensity profile 108, which is virtually coinciding with the intensity profile 109 when having a PSF intensity blur 88 with 20 nm 1sigma blur. The line 110 indicates the target line of 40 nm.

Figure 29A:
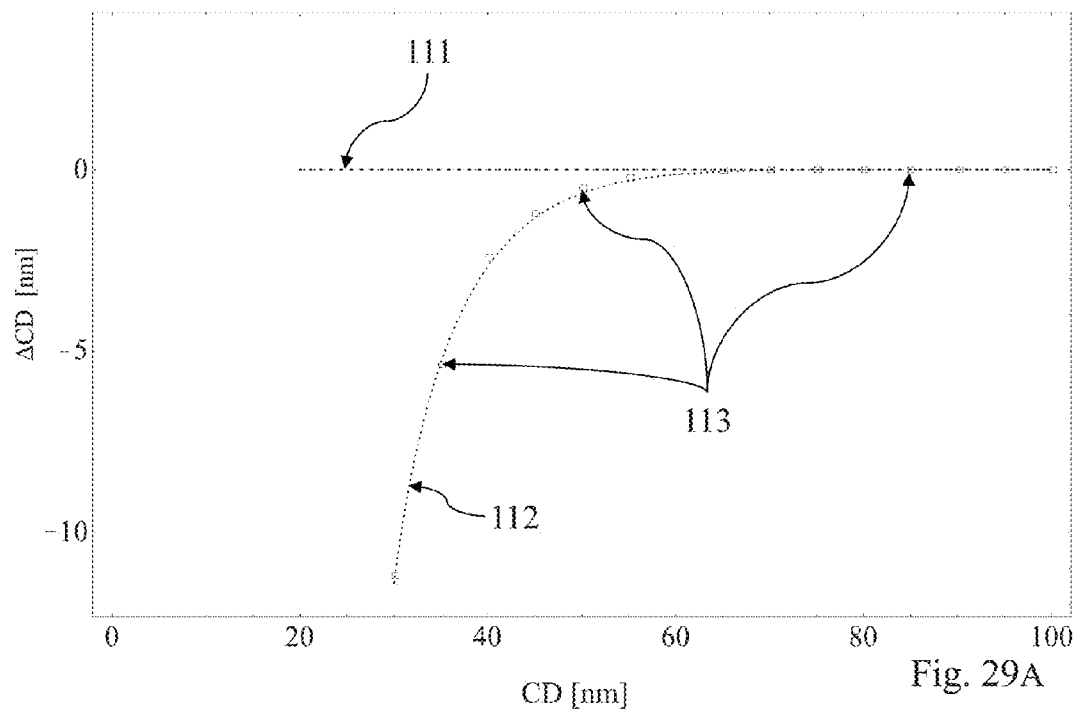
FIG. 29A illustrates the CD deviation as a function of the CD parameter for the MBW, a reference tool having a large PSF, and the matching MBW.

FIG. 29A shows the relationship of ΔCD=(CD*−CD) versus CD for the two writer types. The curve 111 illustrates the relationship for the MBW, in this case for a Quad Grid exposure with 20 nm beam spots with 1sigma blur of 5 nm: there is virtually no deviation, i.e. we have a flat relationship 111. In fact the deviations of the curve 111 from an ideal horizontal line are <±0.1 nm, corresponding to twice the maximum edge position errors of ±0.05 nm as shown in the upper part of FIG. 12B. In contrast, when writing with a 1sigma blur of 20 nm, there are larger deviations for CD values below 100 nm, which is why the values 112 of ΔCD(CD) go down to negative values for decreasing CD. For instance, for CD=30 nm the CD* is approx. 19 nm (cf. FIG. 26), corresponding to a ΔCD of approx. −11 nm.

Figure 29B:
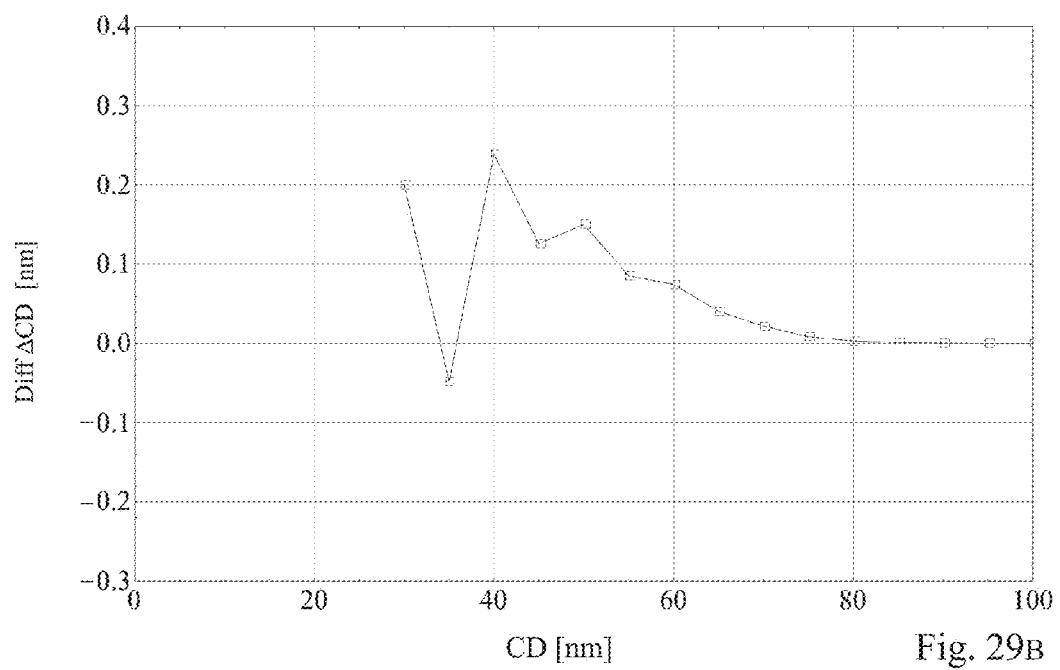
FIG. 29B shows the CD deviation of FIG. 29A at an enlarged scale.

Referring to FIG. 29A, the MBW convoluted with the kernel 89 results in a performance 113 which is virtually the same as 112. FIG. 29B shows in detail the difference between the values of curves 113 and 112 of ΔCD as function of CD. The deviations are smaller than 0.25 nm for CD values equal or above 30 nm. This illustrates that the method according to several embodiments of the invention can emulate MBW tool exposures with large blur to a very good degree with only very small deviations from the significant parameters such as CD. In fact, the deviations could be further reduced by (i) further suitable optimizing the kernel, (ii) using smaller beam size with the MBW, or (iii) using a smaller physical grid on the target in the MBW.

Figure 30:
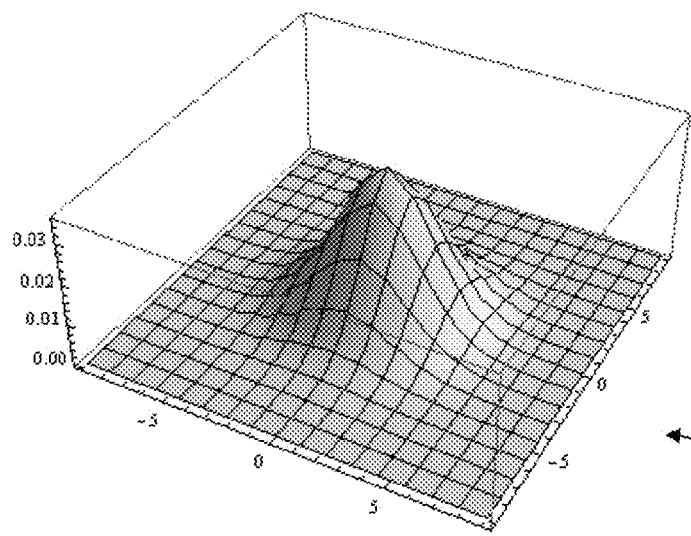
FIG. 30 shows a two-dimensional kernel in a representation as a 3D intensity profile.

In addition to the above one-dimensional examples, two-dimensional simulations were done. For this, an isotropic kernel 121 as illustrated in FIG. 30 may be used. The kernel 121 was generated by rotating the kernel 89 (FIG. 23). The kernel 121 may be represented also in the form of a matrix of (e.g., integer or real) values. For instance, FIG. 31 illustrates a representation of the kernel 121 as an integer matrix 122, where the individual values have been rounded to the next integer value (e.g. 212 is rounded from 211.765); the values need not be normalized to $\Sigma K_{k,l}=1$. The kernel 121 has size of 22×22, but it is expected that for most implementations smaller kernels, such as of sizes 5×5, 7×7 or 11×11, will be sufficient to meet processing requirements; but of course larger kernels may be suitable as well.

The kernel is determined prior to any pattern calculation, and is then applied to the pixel data. The calculation is performed by a convolution so as to obtain the pixel data for the MBW matched to the reference tool. In the example of a matrix kernel 122 with entries $K_{k,l}$, the calculation for the value of each value $P^o_{i,j}$ to be used at the position (i,j) (j-th pixel in the i-th row) for the MBW is:

$$P^o_{i,j}=\Sigma_{k,l}(P_{i+k,j+l}K_{k,l})/K^o, \quad (1)$$

where $P_{i,j}$ denotes the value of pixel at position (i,j) in the original pattern, the sum runs of over the complete set of indices in the kernel matrix; the constant $K^o$ is the normalization of the kernel:

$$K^o=\Sigma_{k,l}K_{k,l} \quad (2)$$

Figures 32A, 32B, 32C:
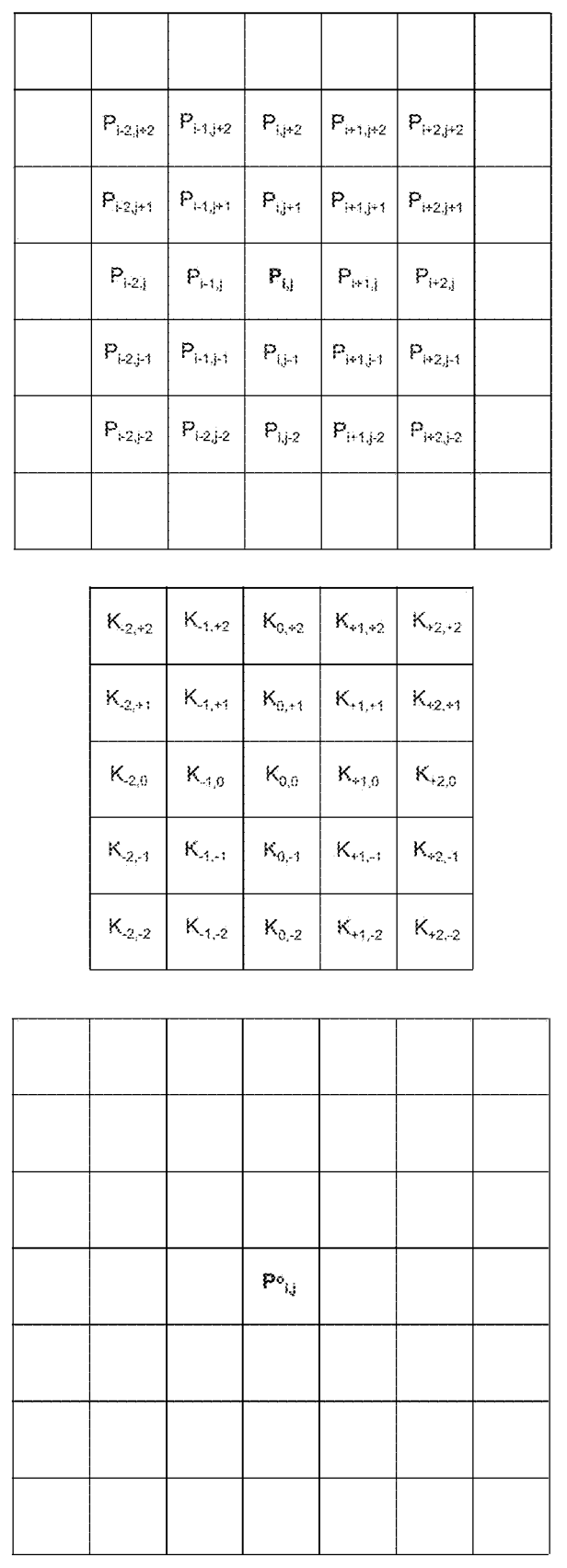

FIGS. 32A-C illustrate a simplified example for a kernel of size 5×5 (FIG. 32B). in order to obtain the value of one of the pixels in the convoluted pattern, $P^o_{i,j}$ in FIG. 32C, the kernel is applied to the pixel data; only those pixels in FIG. 32A are specified by symbols $P_{i+k,j+l}$ which are used in the convolution calculation according to formula (1) above (in this case the offset indices k and j in the sum independently run through values −2, . . . +2).

Figure 33A:
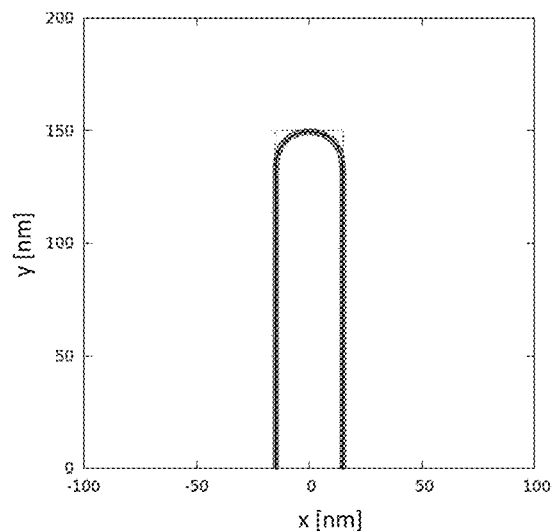
FIGS. 33A-C illustrate 2D representations of a 30 nm line when exposed with the MBW (FIG. 33A), a reference tool (FIG. 33B), and with the matching MBW (FIG. 33C), respectively.
Figure 33B:
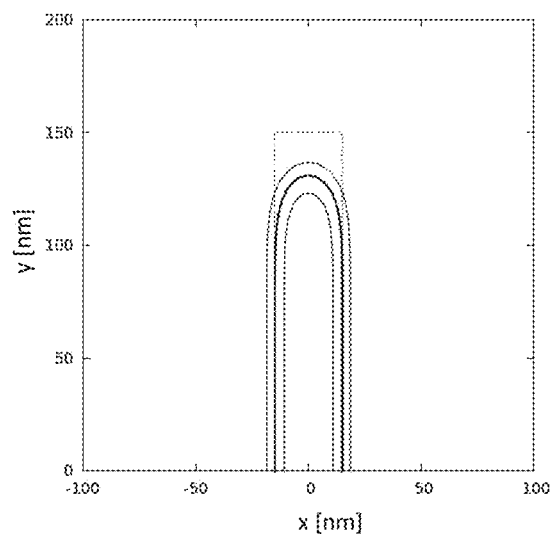
Figure 33C:
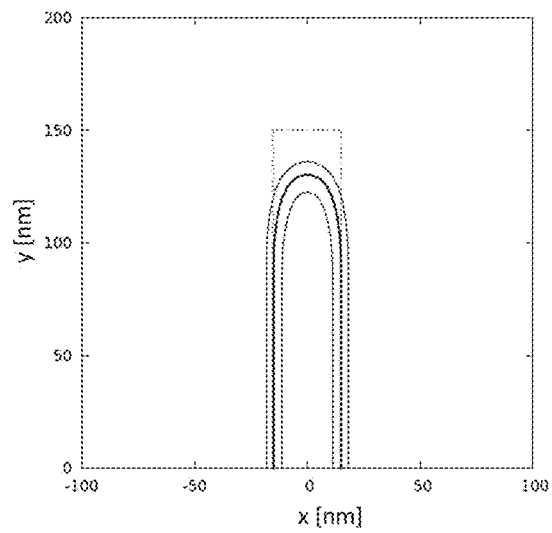

FIG. 33A-C show three 2D simulations for a line having 30 nm width; half of the line is shown only, as the other half is the symmetrical image. Shown are contour plots for 45%, 50%, and 55% dose level with regard to the maximum dose; the dotted rectangle indicates the target shape of the 30 nm line. FIG. 33A illustrates the result of simulations for a line 300 nm long when using the MBW with beam size of 20 nm with a 1sigma blur of 5 nm and Quad Grid exposure (i.e., 5 nm physical grid size). The 50% dose level is the resist contour obtained with development (assuming high resist contrast). FIG. 33B shows the result of corresponding simulations for the reference tool, e.g. a VSB writer with 1sigma blur of 20 nm; for the line with 30 nm line width the result exhibits a clear line edge shortening and degraded dose latitude, as compared to the MBW illustrated in FIG. 33A. FIG. 33C illustrates the result for (simulated) exposure with the MBW convoluted with the kernel 121 of FIG. 30 with the target to match the 30 nm line as exposed with reference tool line. The excellent match with the profile of FIG. 33B is evident.

Anisotropic Kernels, Multiple Kernels and Time-Dependence

Figure 34A:
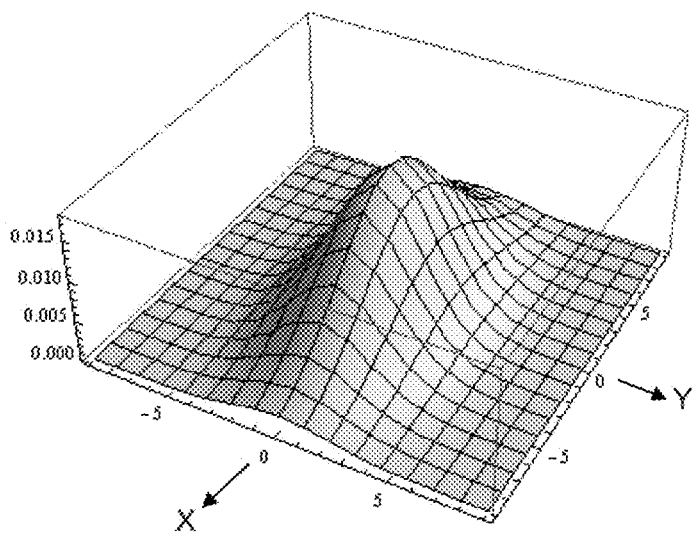
FIGS. 34A,B show kernels with anisotropy with a larger line width along the X direction and the Y direction, respectively.
Figure 34B:
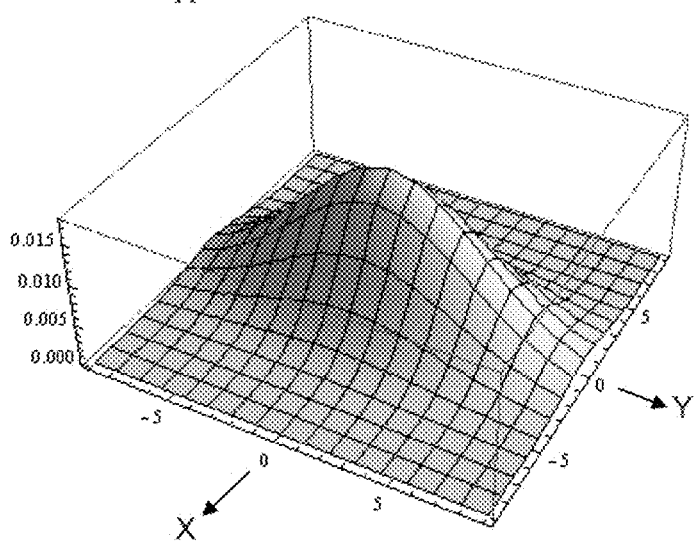
FIG. 34C shows a 2D matrix representation of the kernel of FIG. 34A.

A kernel according to a number of embodiments of the invention need not be isotropic within the XY plane. For example, there may be a situation where a MBW machine has written a mask and careful metrology analysis reveals that on the mask the width of lines in X direction are different from the width of comparable lines in Y direction to a certain extent; in order to emulate such a situation in another MBW device, one suitable approach according to another aspect of several embodiments of the invention is to employ an anisotropic kernel. Examples of anisotropic kernels are shown in FIG. 34A and FIG. 34B. In particular, FIG. 34A illustrates an anisotropic kernel 151 with a large line width along the X direction, about doubled of the line width along the Y direction; in contrast, the kernel 153 depicted in FIG. 34B has an anisotropy with the larger line width along the Y direction. FIG. 34C illustrates a matrix representation 152 of the kernel 151 of FIG. 34A, where, for instance, the individual values (not normalized) are given as real values rounded to one decimal digit. It is worthwhile to note that kernels are not restricted to lines in X or Y directions but may be applied also to anisotropies oriented at an arbitrary angle to X/Y direction.

On the other hand, an anisotropic kernel also offers a way to compensate a known anisotropy in a MBW device or reference tool of other type, for instance an anisotropy towards the X direction could be compensated using a kernel anisotropic towards the Y direction, or vice versa (or with regard to arbitrary perpendicular axes).

It is also important to note that the above examples of kernels are of illustrative purpose only; further implementations of kernels and application to other tasks of considerable importance will be obvious for the skilled person.

One of the many possible variants of a kernel includes time-dependent values. For instance, a time-variation f(t) during a writing process may be implemented, provided such time-variation is known from theoretical considerations and/or experimental data. This allows to take account of time-dependent processes such as ageing of a resist. If the variation of resist sensitivity is known as a function of time, f(t), this function may be used as an additional factor entering the relevant entries in the kernel, i.e., $K_{k,l}=K'_{k,l}\cdot f(t)$, where ($K'_{k,l}$) is an initial, time-independent kernel, for instance the kernel valid for the start of the exposure process. Alternatively or in combination, where the particle beam is generated from a source having a total current which may vary in time, the time-dependency may comprise a function corresponding to a fluctuation function of the total current emitted from the source, which has been experimentally determined prior to the calculation process.

Another aspect of a number of embodiments of the invention is that multiple kernels may be used within one writing process. For instance, different kernels may be used for different areas of the target. This is advantageous in cases where, for instance, the reference tool exhibits varying imaging behavior over the areas on the target to be exposed, such as a non-uniform anisotropy. Also, as already mentioned, the beam size might be changed during the writing process, e.g., from 20 nm to 10 nm, for instance by switching between different aperture arrays within the PD device (see U.S. Pat. No. 8,546,767). In this case, a first kernel is used for the exposure with 20 nm beam size, and a second kernel is used with the 10 nm beam size.

Datapath

Figure 35:
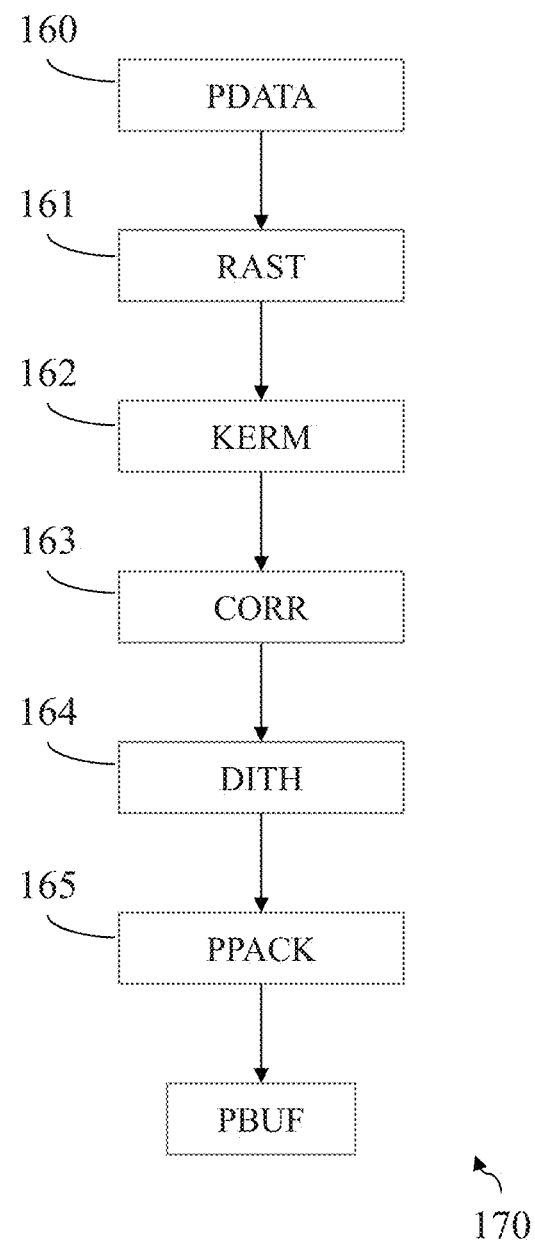
FIG. 35 shows the data path of the MBW.

FIG. 35 shows a flowchart of the datapath 170 in the context of certain embodiments of the invention. The data path is preferably performed in the processing system 18 of the writer tool (FIG. 1) in real time; in a variant, part or all of the calculations of the data path may be performed in advance, for instance in a suitable computer.

The complete pattern image comprises a vast amount of image data, which is why for efficient computation of those data a high-speed datapath that generates the pixel data to be exposed, preferably in real-time, will be suitable. The pattern to be exposed is typically described in a vector format, e.g. as a collection of geometries like rectangles, trapezoids or general polygons, which typically offers better data compaction and therefore reduces the requirements on data storage. The datapath therefore consists of three major parts:

a vector-based physical correction process (step 160), rasterization processes to translate the vector to pixel data (steps 161 to 164), and buffering of pixel data for temporarily storage for the writing process (step 165).

The datapath starts upon being supplied a pattern PDATA to be exposed at step 160. In the case that a Reference Tool shall be matched, e.g. a VSB writer tool, the pattern data may have already been modified in a previous step (not shown) in order to correct for a specific writing behavior, as for example the line end shortening as shown in FIG. 33B. In step 160, generally, the pattern PDATA to be exposed is split into a large number of small data chunks, possibly with geometric overlaps. Corrections that can be applied in the vector domain (e.g. proximity effect correction) may be carried out to all chunks independently, possibly in parallel, and the resulting data is sorted and coded in a way to improve computation speed of the following steps. The output is a collection of chunks where all chunks contain a collection of geometries.

Stage 161: Rasterization RAST. The geometries of every chunk are converted into a raster graphics array, where the pixel gray level represents the physical dose of the corresponding aperture image. Every pixel that is completely inside a geometry is assigned the color of the polygon, whereas the color of pixels that cross an edge of a geometry is weighed by the fraction of the area of the pixel that is covered by the geometry. This method implies a linear relation between the area of the geometry and the total dose after the rasterization. The doses are first calculated as floating point numbers; only later they are converted to the discrete set of dose values as supported by the PD device. As a result of rasterization the pixel data will be in the format of floating point numbers representing nominal dose values P for the respective pixels.

Stage 162: Kernel matching KERM. A pre-determined MCK kernel is applied to the pixel data. This is done by a convoluting the pixel data with the kernels described above. Preferably, in order to achieve real-time processing speed, a sufficient number of parallel CPUs and GPUs are used. Since the convolution kernel typically acts on the range of the blur, which is a few tens on nanometers, it is possible to parallelize the calculation processes in an effective way where the pixel data of the beam array are distributed over different CPUs and/or GPUs.

Stage 163: Other pixel based corrections CORR, such as compensation of deviations from a uniform current density of the beam 50 over the aperture field, and/or correction for individual defective beam deflectors in the DAP 30. Correction methods of this kind do not form part of the invention and are not discussed here.

Stage 164: Dithering DITH. The dithering process converts the convoluted, and possibly corrected, dose value data P° into gray value data, based on a predetermined gray value scale. This is a position-dependent rounding process that ensures that rounding errors are averaged over nearby pixels which, combined with oversampling, allows for a much finer dose variation than with the discrete set of dose values available for a single aperture; it can be realized by means of known algorithms for the conversion of visual image data into pixel graphics. It is possible to apply additional corrections (which are not part of the present invention) at this stage, provided they can be applied in the pixel domain, immediately before or after dithering depending on the actual correction (e.g. defective apertures correction).

Stage 165: Pixel packaging, PPACK. The pixel image obtained from stage 164 is sorted according to the placement grid sequence and sent to a pixel buffer PBUF which is provided in the processing system 18 of the writer tool (FIG. 1). The pixel data is buffered until a sufficient amount of data, typically at least the length of a stripe, is present which triggers the exposure of the stripe (see FIG. 7). The data is taken out of the buffer during the writing process. After the stripe has been written, the process described above starts anew for the pattern data of the next region, such as the next stripe.

Determination of the MCK Kernel

It is quite usual that the intensity profile of the reference tool, for instance the intensity profile 87, 88 of a VSB writer (FIG. 21), is known; for instance it has been determined experimentally. Alternatively, linearity plots (FIG. 29A) may be known for the reference tool, from which the intensity profile can be calculated, or an experimental set of data, for example, a set of line widths as function of varying dose or varying design width, printed by the reference tool may be taken as initial data to determine the intensity profile. For determination/optimization of the MCK kernel, it is here assumed that the intensity profiles are known (mathematically, the point spreading function, which is the dose distribution that an indefinitely small pattern element, like for example a delta function, generates on the substrate during the exposure, including blurring and other imaging artifacts).

The determination and optimization of the MCK is typically an iterative process, where a certain number of points representing the MCK kernel is varied systematically and/or stochastically so as to be optimized with respect to a target function (figure of merit). The target function can, for example, be the integral of the difference in linearity function (cf. FIG. 29B) or, in case of optimizing directional line width variation as discussed with reference to FIGS. 34A and 34B, the difference between the line widths for the line directions of interest.

Generally, such an optimization can be done with conventional algorithms using mathematical principles well-known in the state of the art. One standard methodology that can be used is a gradient method, or a linear regress method. As starting function, for example, the intensity profile of the reference tool, shown as an example in FIG. 24D in form of a single Gaussian function, is used. In fact, in many cases the intensity profile already presents a suitably good approximation for the final kernel, and further optimization is only needed in order to comply with higher demands in accuracy of the matching. The larger the difference of the blurs, the better the matching works and the more the kernel function will be dominated by the intensity distribution given by the larger blur.

Figure 24A:
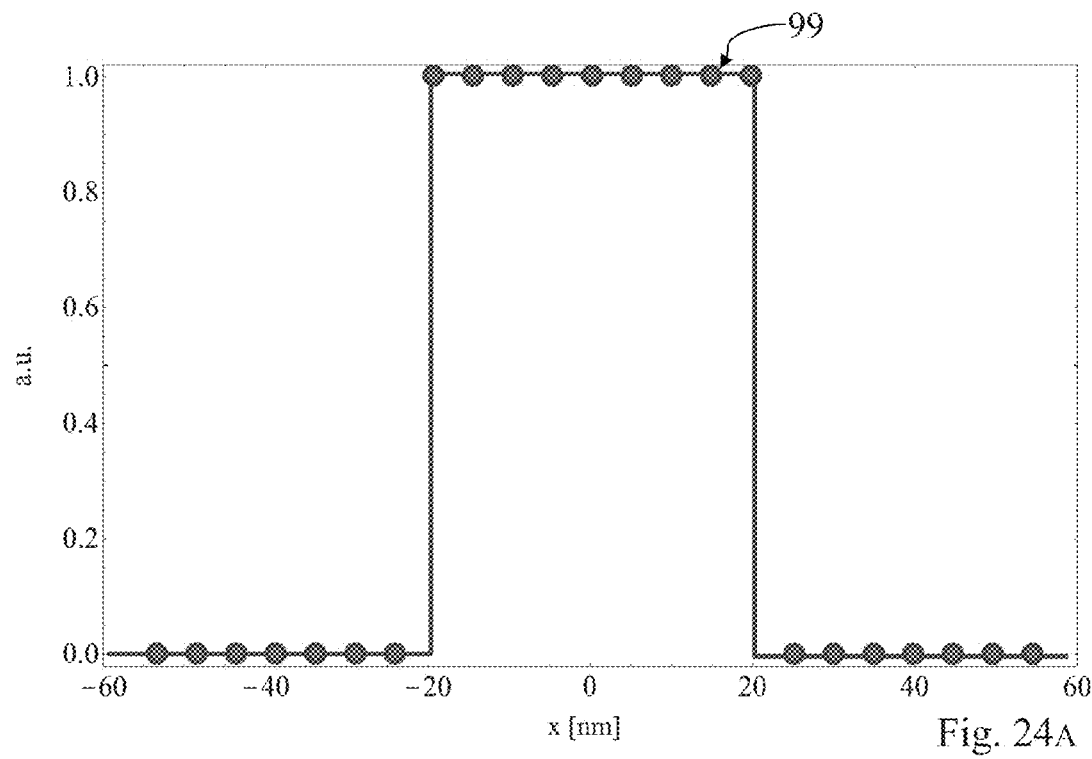
FIGS. 24A-D show examples of simple kernels each of which is suitable as a kernel according to several embodiments of the invention, or as a starting point for calculating a kernel.
Figure 24B:
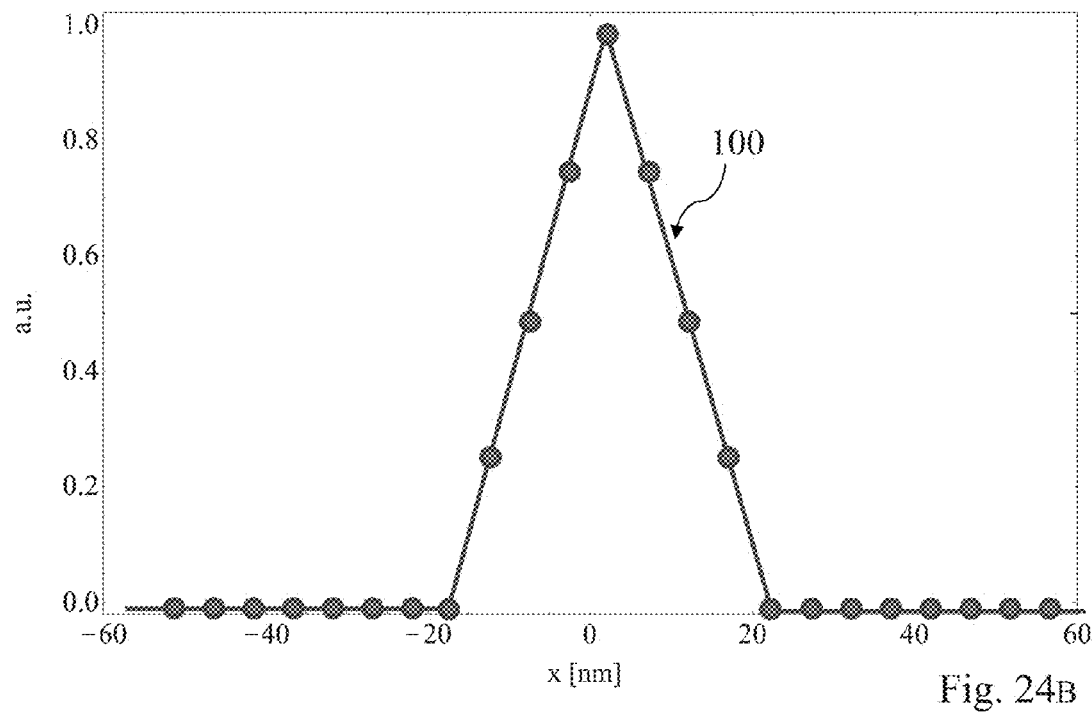
Figure 24C:
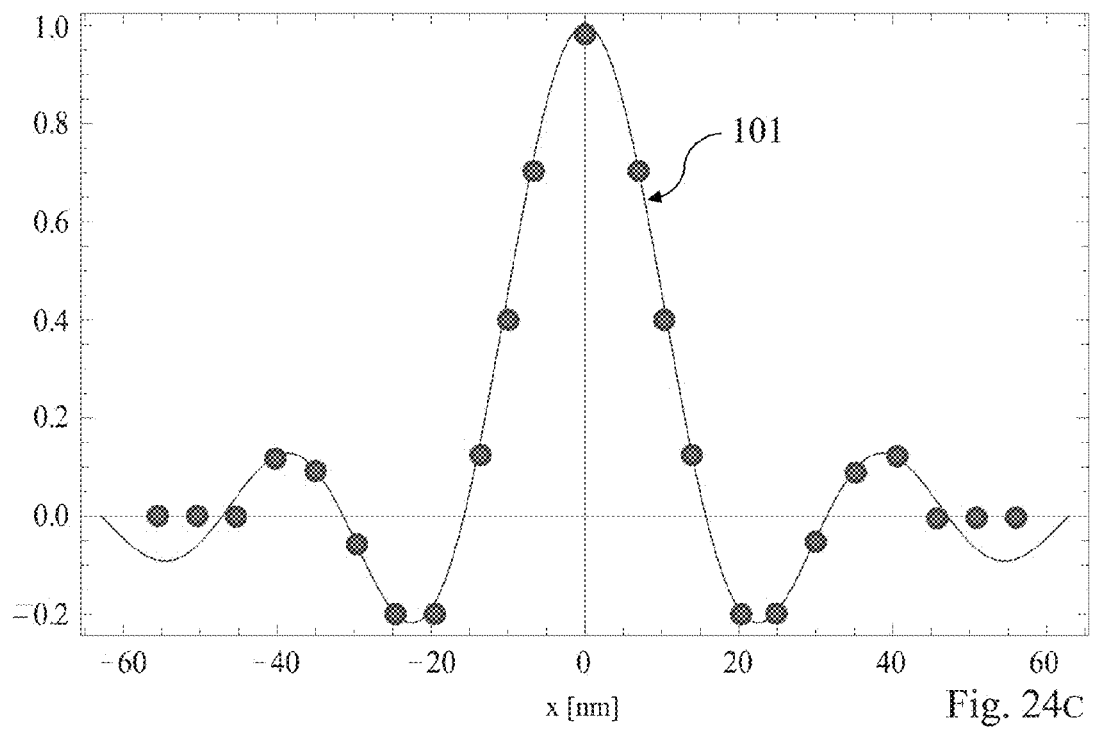
Figure 24D:
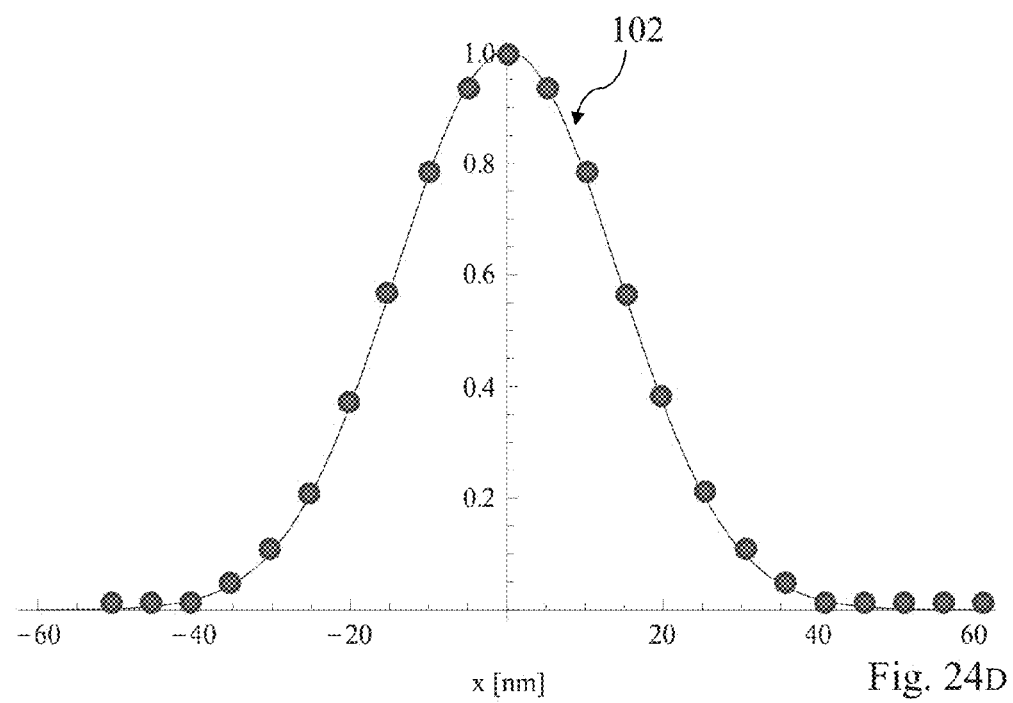

FIGS. 24A-D show examples of kernel functions that are suitable as starting functions for the linear regress calculation to find the optimum kernel. Alternatively, they may be sufficient for a number of tasks directly (without subsequent optimization). In particular, a rectangle function as depicted in FIG. 24A can also be used to achieve certain purposes as for example "moving averaging", the triangle function of FIG. 24B is suitable for performing a weighted averaging, or a sin c function as depicted in FIG. 24C may be used to obtain an "edge enhancement" or "patterns selective" filtering, where the kernel has the effect of a differentiation; finally, FIG. 24D illustrates a Gaussian shape. Please note that the negative values of the sin c-shaped kernel may result in nominal negative doses, to be replaced by a non-negative cut-off value such as zero, in order to avoid negative dose values on the substrate.

Of course, the MBW will itself have a blur (due to width of a spot and the point spread function). The MBW blur is usually very small as compared to the line width to be written on the target (by a factor of at least 1.5, typically 3 or even more), and even more so as compared the blur of the reference tool; therefore the MBW blur can be neglected for determining the kernel without significant detriment at least at the first stage. In the iterative approach, this is a safe procedure since the iteration will implicitly take into account effects of the MBW blur. In fact, it was found that usually the deviations introduced by neglecting the MBW blur in the kernel are marginal only already at the first stage.

The invention claimed is:

1. Method for computing an exposure pattern for exposing a desired pattern on a target in a charged-particle multi-beam processing apparatus, in which a particle beam is directed to and illuminates a pattern definition device comprising an aperture array composed of a plurality of blanking apertures through which said particle beam penetrates for writing said desired pattern by exposing a multitude of pixels within an image area on the target, wherein in the pattern definition device said plurality of blanking apertures is arranged in a predetermined arrangement defining mutual positions of the blanking apertures, each blanking aperture being selectively adjustable with regard to a dose value to be exposed through the respective blanking aperture onto a corresponding aperture image generated on the target during a respective exposure interval, said dose value taking a respective value selected from a discrete gray scale, wherein during a writing process of said desired pattern, a sequence of exposure intervals is made, wherein in each exposure interval the blanking apertures are imaged onto the target, thus generating a corresponding plurality of aperture images, wherein the method comprises:
i) providing the desired pattern as a graphical representation on the image area on the target, said graphical representation having a predetermined width of resolution, said width being larger than a nominal distance between neighboring positions of the pixels within said image area,
ii) providing a convolution kernel, said kernel describing a mapping from an element of the graphical representation to a group of pixels, said group of pixels being centered around a nominal position of said element, and
iii) calculating a nominal exposure pattern as a pixel raster graphics defined on the multitude of pixels, by convolution of the graphical representation with the convolution kernel, said nominal exposure pattern being suitable to create a nominal dose distribution on the target, wherein the convolution kernel is configured to compensate a deviation of the imaging from the pattern definition device to the target, said deviation concerning a desired value of critical dimension along at least one direction in the image area on the target.

2. The method according to claim 1, wherein the writing process generates aperture images which are mutually overlapping, and the aperture images have a nominal width which is a multiple of the distance between pixel positions of neighboring aperture images generated on the target, the method having the additional step:
iv) generating, from the nominal exposure pattern, an exposure pattern suitable to expose the desired pattern by said writing process through exposure of aperture images.

3. The method according to claim 1, wherein in step i, the graphical representation is a raster graphics on a reference raster having a raster width, said raster width being used as width of resolution.

4. The method according to claim 1, wherein in step i, the graphical representation is a vector graphics which is converted to a raster graphics on a reference raster having a raster width which is larger than a nominal distance between neighboring positions of the pixels within said image area.

5. The method according to claim 1, wherein the calculations of step iii, and subsequent calculations if present, are performed during a writing process in real time, performing associated calculations transiently without permanent storing of the data calculated.

6. The method according to claim 1, wherein the convolution kernel represents a point spreading function of a reference writing apparatus to be emulated by means of said processing apparatus.

7. The method according to claim 1, wherein the convolution kernel is represented as a discrete matrix of pixel values, and the convolution in step iii is performed as discrete convolution.

8. The method according to claim 1, wherein the convolution kernel includes time-dependent values, having a time dependency corresponding to a time-dependent writing behavior of a reference writing apparatus to be emulated.

9. The method according to claim 1, wherein the convolution kernel is anisotropic with regard to critical dimensions along the two main directions on the image area as generated during imaging the blanking apertures onto the target.

10. The method according to claim 1, wherein, based on a predefined partition of the area of the aperture array into a plurality of sub-areas, two or more different convolution kernels are used, where each sub-area among said plurality of sub-areas is associated with one of the kernels, which is used in the respective subarea.

11. The method according to claim 1, wherein the convolution in step iii is performed using arithmetic values which have an arithmetic precision higher than the resolution of the discrete gray scale.

12. The method according to claim 1, wherein two or more convolution kernels are used, each kernel being used on a respective sub-area among a plurality of sub-areas within the image area and/or with a respective aperture array from a plurality of aperture arrays associated with the pattern definition device.

13. The method according to claim 1, wherein during the writing process the position of aperture images is kept fixed relative to the target at the position of a pixel during an exposure interval, but between exposure intervals the position of aperture images is shifted over the target, thus exposing the multitude of pixels within said image area on the target.

14. The method according to claim 1, wherein the width of resolution of the graphical representation is larger than a nominal width of the aperture images generated by the charged-particle multi-beam processing apparatus.

15. The method according to claim 1, wherein in step i, the graphical representation is a vector graphics which is converted to a raster graphics on a reference raster having a raster width.

16. Charged-particle multi-beam processing apparatus for exposure of a target by means of a structured beam of electrically charged particles, comprising:
an illumination system,
a pattern definition device and
a projection optics system, the illumination system being configured to produce a beam of said electrically charged particles and form it into a wide beam illuminating the pattern definition device, the pattern definition device being configured to form the shape of the illuminating beam into a structured beam composed of a multitude of sub-beams, and the projection optics system being configured to project an image of the beam shape defined in the pattern definition device onto the target, thus exposing a multitude of pixels within an image area on the target, wherein the pattern definition device comprises an aperture array composed of a plurality of blanking apertures forming said sub-beams, said plurality of blanking apertures being arranged in a predetermined arrangement defining mutual positions of the blanking apertures, each blanking aperture being selectively adjustable with regard to a dose value to be exposed through the respective blanking aperture onto a corresponding aperture image generated on the target during a respective exposure interval, said dose value taking a respective value selected from a discrete gray scale, configured such that wherein during a writing process of a desired pattern, a sequence of exposure intervals is made, wherein in each exposure interval the blanking apertures are imaged onto the target, thus generating a corresponding plurality of aperture images, said processing apparatus being configured for performing a writing process for a desired pattern using a method comprising:

i) providing the desired pattern as a graphical representation on the image area on the target, said graphical representation having a predetermined width of resolution, said width being larger than a nominal distance between neighboring positions of the pixels within said image area, ii) providing a convolution kernel, said kernel describing a mapping from an element of the graphical representation to a group of pixels, said group of pixels being centered around a nominal position of said element, and iii) calculating a nominal exposure pattern as a pixel raster graphics defined on the multitude of pixels, by convolution of the graphical representation with the convolution kernel, said nominal exposure pattern being suitable to create a nominal dose distribution on the target, the method operating to convert the desired pattern into a nominal exposure pattern writable with the processing apparatus, wherein the convolution kernel is configured to compensate a deviation of the imaging from the pattern definition device to the target, said deviation concerning a desired value of critical dimension along at least one direction in the image area on the target.

* * * * *